(12) United States Patent
Niu et al.

(10) Patent No.: US 11,864,447 B2
(45) Date of Patent: Jan. 2, 2024

(54) DISPLAY SUBSTRATE, DISPLAY DEVICE AND HIGH-PRECISION METAL MASK

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Tong Niu, Beijing (CN); Ming Hu, Beijing (CN); Chang Luo, Beijing (CN); Jianpeng Wu, Beijing (CN); Benlian Wang, Beijing (CN); Fengli Ji, Beijing (CN); Peng Xu, Beijing (CN); Qian Xu, Beijing (CN); Guomeng Zhang, Beijing (CN); Yan Huang, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 272 days.

(21) Appl. No.: 17/417,709

(22) PCT Filed: Sep. 30, 2020

(86) PCT No.: PCT/CN2020/119229
§ 371 (c)(1),
(2) Date: Jun. 23, 2021

(87) PCT Pub. No.: WO2022/052193
PCT Pub. Date: Mar. 17, 2022

(65) Prior Publication Data
US 2022/0336541 A1    Oct. 20, 2022

(30) Foreign Application Priority Data

Sep. 10, 2020  (WO) ................ PCT/CN2020/114622

(51) Int. Cl.
*H01L 27/32* (2006.01)
*H10K 59/35* (2023.01)
(Continued)

(52) U.S. Cl.
CPC ......... *H10K 59/353* (2023.02); *C23C 14/042* (2013.01); *H10K 59/352* (2023.02); *C23C 14/12* (2013.01); *H10K 59/122* (2023.02)

(58) Field of Classification Search
CPC ........................ H10K 59/352; H10K 59/353
See application file for complete search history.

(56) References Cited

U.S. PATENT DOCUMENTS

| 5,506,434 A | 4/1996 | Yonemoto |
| 2012/0184059 A1 | 7/2012 | Chiang et al. |

(Continued)

FOREIGN PATENT DOCUMENTS

| CN | 207966994 U | 10/2018 | |
| CN | 207966994 U | * 10/2018 | ............. C23C 14/04 |

(Continued)

OTHER PUBLICATIONS

Translation, Written Opinion of International Searching Authority, International Searching Authority, International application No. PCT/CN2020/119229, dated Jun. 9, 2021, all pages. (Year: 2021).*

(Continued)

*Primary Examiner* — Victoria K. Hall
(74) *Attorney, Agent, or Firm* — BROOKS KUSHMAN P.C.

(57) ABSTRACT

Display substrate, display device, high-precision metal mask are provided. Display substrate includes: first, second, and third sub-pixels; in first direction, first and third sub-pixels are alternately arranged to form first sub-pixel rows, second sub-pixels form second sub-pixel rows; in second direction, first and second sub-pixel rows are alternately arranged; two (Continued)

first and two third sub-pixels in two adjacent rows and two adjacent columns form 2*2 array; in the array, two first sub-pixels are in different rows and in different columns, so are the two third sub-pixels, connection lines of centers of two first and two third sub-pixels form virtual quadrilateral, second sub-pixel is within virtual quadrilateral; for multiple distances from centers of two first and two third sub-pixels corresponding to same virtual quadrilateral to center of second sub-pixel, at least two distances are different. Brightness centers of virtual pixels have more uniform distribution.

16 Claims, 18 Drawing Sheets

(51) Int. Cl.
*C23C 14/04* (2006.01)
*H10K 59/122* (2023.01)
*C23C 14/12* (2006.01)

(56) References Cited

U.S. PATENT DOCUMENTS

| | | | | |
|---|---|---|---|---|
| 2018/0342571 A1* | 11/2018 | Kwon | | H10K 59/352 |
| 2019/0252469 A1 | 8/2019 | Xiao et al. | | |
| 2020/0357322 A1* | 11/2020 | Wu | | H10K 59/353 |
| 2020/0402442 A1* | 12/2020 | Liu | | G09F 9/33 |

FOREIGN PATENT DOCUMENTS

| | | | | | |
|---|---|---|---|---|---|
| CN | 207966995 U | * | 10/2018 | ............. | C23C 14/04 |
| CN | 207966995 U | | 10/2018 | | |
| CN | 208077981 U | | 11/2018 | | |
| CN | 208077981 U | * | 11/2018 | ............. | C23C 14/04 |
| CN | 109860237 A | | 6/2019 | | |
| CN | 110137206 A | | 8/2019 | | |
| CN | 110137210 A | * | 8/2019 | ........... | C23C 14/042 |
| CN | 110137210 A | | 8/2019 | | |
| CN | 110767733 A | | 2/2020 | | |
| CN | 110767733 A | * | 2/2020 | ............. | H01L 27/32 |
| CN | 110828534 A | | 2/2020 | | |
| CN | 110828534 A | * | 2/2020 | ........... | C23C 14/042 |
| CN | 11341817 A | | 6/2020 | | |
| WO | WO 2019134521 | * | 7/2019 | ............. | H01L 27/32 |
| WO | WO2019134521 A1 | * | 7/2019 | ............. | H01L 27/32 |

OTHER PUBLICATIONS

Translation, International Search Report, International Searching Authority, International application No. PCT/CN2020/119229, dated Jun. 9, 2021, all pages. (Year: 2021).*
Machine translation, Li, Chinese Pat. Pub. No. CN110828534A, translation date: May 5, 2023, Espacenet, all pages. (Year: 2023).*
Machine translation, Li, Chinese Pat. Pub. No. CN207966995U, translation date: May 5, 2023, Espacenet, all pages. (Year: 2023).*
Machine translation, Wu, Chinese Pat. Pub. No. CN110137210A, translation date: May 5, 2023, Espacenet, all pages. (Year: 2023).*
Machine translation, Wu, Chinese Pat. Pub. No. CN207966994U, translation date: May 5, 2023, Espacenet, all pages. (Year: 2023).*
Machine translation, Xiao, Chinese Pat. Pub. No. CN208077981U, translation date: May 5, 2023, Espacenet, all pages. (Year: 2023 ).*
Machine translation, Zhang, Chinese Pat. Pub. No. CN110767733A, translation date: May 5, 2023, Espacenet, all pages. (Year: 2023).*
International Search Report and Written Opinion for Application No. PCT/CN2020/114622, dated May 27, 2021, 9 Pages.
International Search Report and Written Opinion for Application No. PCT/CN2020/119229, dated Jun. 9, 2021, 10 3ages.

* cited by examiner

DISPLAY SUBSTRATE, DISPLAY DEVICE AND HIGH-PRECISION METAL MASK

CROSS-REFERENCE TO RELATED APPLICATIONS

This application is the U.S. national phase of PCT Application No. PCT/CN2020/119229 filed on Sep. 30, 2020, which claims a priority of PCT Application No. PCT/CN2020/114622 filed on Sep. 10, 2020, which are incorporated herein by reference in their entireties.

TECHNICAL FIELD

The present disclosure relates to the field of display technology, and in particular to a display substrate, a display device and a high-precision metal mask.

BACKGROUND

An organic light-emitting diode (OLED) display device includes a base substrate, a light-emitting layer, and an encapsulation protection layer. The light-emitting layer includes sub-pixels arranged in an array on the base substrate. For each sub-pixel, a fine metal mask (FMM) is generally used to evaporate an organic light-emitting material onto the corresponding sub-pixel position of the array substrate. With the development of technology, people have increasingly high requirements for resolution of display devices.

At present, limited to production level of the FMM and precision of the evaporation process, it is difficult to increase the resolution by reducing sub-pixel sizes and reducing pixel pitches. A commonly used method is sub-pixel rendering (SPR) technology, which uses sub-pixels that share certain positions in different pixels, so as to use relatively few sub-pixels to simulate a higher resolution. SPR increases the aperture ratio of the light-emitting layer, and improves the aperture ratio and lifetime of the display device. However, in the pixel arrangement structure in the conventional technologies, brightness centers of virtual pixels usually have a nonuniform distribution. As a result, when displaying some characters and specific graphics, graininess and distortion of the display are inevitably caused.

SUMMARY

In view of the above, the present disclosure provides a display substrate, a display device, and a high-precision metal mask, which are used to solve the problem of graininess and distortion of display caused by nonuniform arrangement of brightness centers of virtual pixels of the pixel arrangement structure in the conventional technologies.

To solve the above technical problem, the present disclosure adopts the following technical solutions.

In a first aspect, embodiments of the present disclosure provide a display substrate, including: first sub-pixels, second sub-pixels and third sub-pixels;
  in a first direction, the first sub-pixels and the third sub-pixels are alternately arranged to form first sub-pixel rows, and the second sub-pixels form second sub-pixel rows;
  in a second direction, the first sub-pixel rows and the second sub-pixel rows are alternately arranged, and the first direction and the second direction are substantially perpendicular;
  two first sub-pixels and two third sub-pixels in two adjacent rows and two adjacent columns form a 2*2 array; in the 2*2 array, the two first sub-pixels are in different rows and in different columns, the two third sub-pixels are in different rows and in different columns, connection lines of centers of the two first sub-pixels and the two third sub-pixels form a virtual quadrilateral, and the second sub-pixel is within the virtual quadrilateral;
  for multiple distances that are from the centers of the two first sub-pixels and the centers of the two third sub-pixels corresponding to a same virtual quadrilateral to a center of the second sub-pixel, at least two distances among the multiple of distances are different;
  the third sub-pixel has a symmetry axis along a first oblique line direction and a symmetry axis along a second oblique line direction, and a width of the third sub-pixel in the first oblique line direction is different from that in the second oblique line direction; and/or, the first sub-pixel has a symmetry axis along a first oblique line direction and a symmetry axis along a second oblique line direction, and a width of the first sub-pixel in the first oblique line direction is different from that in the second oblique line direction;
  the second oblique line direction is substantially perpendicular to the first oblique line direction, and the second oblique line direction and the first oblique line direction intersect both the first direction and the second direction.

Optionally, an interior angle of the virtual quadrilateral is in a range of 700 to 120°.

Optionally, the two first sub-pixels and the two third sub-pixels corresponding to a same virtual quadrilateral surround one second sub-pixel, and a minimum distance among distances that are from other first sub-pixels and other third sub-pixels outside the virtual quadrilateral to the surrounded second sub-pixel, is greater than, a minimum distance among distances that are from the two first sub-pixels and two third sub-pixels corresponding to the same virtual quadrilateral to the surrounded second sub-pixel.

Optionally, for the multiple distances that are from the centers of the two first sub-pixels and the centers of the two third sub-pixels corresponding to a same virtual quadrilateral to the center of the second sub-pixel, a ratio of any two distances among the multiple distances is in a range of 0.7 to 1.3.

Optionally, a difference between the distances from the centers of the two first sub-pixels to the center of the second sub-pixel corresponding to a same virtual quadrilateral, is smaller than, a difference between the distances from the centers of the two third sub-pixels to the center of the second sub-pixel corresponding to the same virtual quadrilateral.

Optionally, for the same virtual quadrilateral, the distances from the centers of the two first sub-pixels to the center of the second sub-pixel are substantially equal.

Optionally, each of the distances from the centers of the two first sub-pixels and the centers of the two third sub-pixels corresponding to a same virtual quadrilateral to the center of the second sub-pixel ranges from 20 μm to 60 μm.

Optionally, the first sub-pixel and the third sub-pixel have different shapes.

Optionally, the first sub-pixel and the third sub-pixel each are an axisymmetric pattern, and a symmetry axis of at least one first sub-pixel and a symmetry axis of at least one third sub-pixel are parallel and do not coincide; and/or,
  the first sub-pixel has a symmetry axis in a first oblique direction, and symmetry axes in the first oblique direction of two adjacent first sub-pixels in the first oblique direction do not coincide; and/or, the third sub-pixel has a symmetry axis in a first oblique direction, and symmetry axes in the first oblique direction of two adjacent third sub-pixels in the first oblique direction do not coincide.

Optionally, in at least one virtual quadrilateral, the distances from the center of the second sub-pixel to the centers of the two third sub-pixels are not equal, and the distances from the center of the second sub-pixel to the centers of the two first sub-pixels are approximately equal; or, in at least one virtual quadrilateral, the distances from the center of the second sub-pixel to the centers of the two third sub-pixels are approximately equal, and the distance from the center of the second sub-pixel to the centers of the two first sub-pixels are approximately equal; or, in at least one virtual quadrilateral, the distances from the center of the second sub-pixel to the centers of the two third sub-pixels are approximately equal, and the distances from the center of the second sub-pixel to the centers of the two first sub-pixels are not equal.

Optionally, in at least one virtual quadrilateral, the distance from the second sub-pixel to a first one of the third sub-pixels is L1, and the distance from the second sub-pixel to a center of a second one of the third sub-pixels is L2, and the distances from the second sub-pixel to the two first sub-pixels are both L1; or, in at least one virtual quadrilateral, each of the distances from the second sub-pixel to the two third sub-pixels and the distance from the second sub-pixel to the two first sub-pixels is L1; or, in at least one virtual quadrilateral, each of the distances from the second sub-pixel to the two third sub-pixels and the distances from the second sub-pixel to the two first sub-pixels is L2; or, in at least one virtual quadrilateral, the distances from the second sub-pixel to the two third sub-pixels are both L1, and the distance from the second sub-pixel to a first one of the first sub-pixels is L1, and the distance from the second sub-pixel to a second one of first sub-pixels is L2; or, in at least one virtual quadrilateral, the distances from the second sub-pixel to the two third sub-pixels are both L2, and the distances from the second sub-pixel to the two first sub-pixels are both L1;

L2 is greater than L1.

Optionally, a difference between L2 and L1 is greater than or equal to 1 µm, and a range of L1 is 12 µm to 30 µm.

Optionally, the virtual quadrilateral is a right-angled trapezoid, two interior angles of the virtual quadrilateral each are 90°, one of other two interior angles of the virtual quadrilateral is an obtuse angle, and one of the other two interior angles of the virtual quadrilateral is an acute angle.

Optionally, a range of each of all interior angles of the virtual quadrilateral is 700 to 120°.

Optionally, some of the virtual quadrilaterals each are a first parallelogram, and some of the virtual quadrilaterals each are a second parallelogram; in a row direction and in a column direction, the first parallelograms and the second parallelograms are arranged alternately; at least one interior angle of the first parallelogram and at least one interior angle of the second parallelogram are different.

Optionally, a range of each of an acute angle of the first parallelogram and an acute angle of the second parallelogram is greater than or equal to 700 and less than 90°.

Optionally, for the third sub-pixel and/or the first sub-pixel, a difference between the width in the first oblique line direction and the width in the second oblique line direction is greater than or equal to 1 µm.

Optionally, for the second sub-pixel, a width in the first oblique line direction and a width in the second oblique line direction are different.

Optionally, in the virtual quadrilateral, the second sub-pixel is approximately symmetrical with respect to a connection line of the centers of the two third sub-pixels that are adjacent in the first oblique line direction or the second oblique line direction, and is approximately symmetrical with respect to a connection line of the centers of the two first sub-pixels that are adjacent in the second oblique line direction or the first oblique line direction.

Optionally, four virtual quadrilaterals in an array form a virtual polygon, and the first sub-pixels and the third sub-pixels are on corners or edges of the virtual polygon, and are alternately distributed on the edges or the corners of the virtual polygon in a clockwise direction.

Optionally, in the virtual polygon, the centers of the third sub-pixels in a same row are approximately on a straight line parallel to a row direction, and/or the centers of the third sub-pixels in a same column are approximately on a straight line parallel to a column direction.

Optionally, in the virtual polygon, the centers of the second sub-pixels in a same row are approximately on a straight line parallel to a row direction, and/or the centers of the second sub-pixels in a same column are approximately on a straight line parallel to a column direction.

Optionally, respective total opening areas of the third sub-pixels, the second sub-pixels, and the first sub-pixels are sequentially decreased, the total opening area of the first sub-pixels is x, the total opening area of the second sub-pixels is a*x, and the total opening area of the third sub-pixels is b*x, where $0.5 \leq a \leq 0.8$ and $1 \leq b \leq 2.2$.

Optionally, each of shapes of the first sub-pixel, the second sub-pixel, and the third sub-pixel is any of a polygon, a circle, or an ellipse.

Optionally, each of the shapes of the first sub-pixel, the second sub-pixel, and the third sub-pixel is any of a quadrilateral, a hexagon, an octagon, a quadrilateral with rounded corners, a hexagon with rounded corners, an octagon with rounded corners, a circle, or an ellipse.

Optionally, the first sub-pixel is a red sub-pixel, the second sub-pixel is a green sub-pixel, and the third sub-pixel is a blue sub-pixel.

In a second aspect, embodiments of the present disclosure provide a display device including the display substrate according to the first aspect.

Optionally, the display device further includes a pixel defining layer, the pixel defining layer includes multiple pixel defining layer openings, each of the first sub-pixels, the second sub-pixels and the third sub-pixels corresponds to a pixel defining layer opening of the multiple pixel defining layer openings, and shapes of the first sub-pixel, the second sub-pixel and the third sub-pixel are approximately the same as shapes of their respective pixel defining layer openings.

Optionally, the first sub-pixel includes multiple films, and the multiple films of the first sub-pixel at least partially cover a region outside the pixel defining layer opening; and/or, the second sub-pixel includes multiple films, and the multiple films of the second sub-pixel at least partially cover a region outside the pixel defining layer opening; and/or, the third sub-pixel includes multiple films, and the multiple films of the third sub-pixel at least partially cover a region outside the pixel defining layer opening.

Optionally, at least some of the multiple pixel defining layer openings are different in shapes or areas Optionally, at least some of the pixel defining layer openings corresponding to the first sub-pixels or the third sub-pixels are different in shapes or areas.

Optionally, at least some of the pixel defining layer openings corresponding to the first sub-pixels or the third sub-pixels have different minimum distances from their respective adjacent openings.

In a third aspect, embodiments of the present disclosure provide a high-precision metal mask for manufacturing the display substrate according to the first aspect, the first sub-pixel includes multiple films, and the second sub-pixel includes multiple films, the third sub-pixel includes multiple films, the mask includes multiple opening regions, and the multiple opening regions include: a first opening region corresponding to a shape and a distribution of at least one film in the first sub-pixel, or a second opening region corresponding to a shape and a distribution of at least one film in the second sub-pixel, or a third opening region corresponding to a shape and a distribution of at least one film in the third sub-pixel.

The beneficial effects of the above technical solutions of the present disclosure are as follows.

In the embodiments of the present disclosure, on the one hand, by sharing sub-pixels, higher resolution can be achieved; on the other hand, the widths of the first pixel and/or the third sub-pixel in different oblique line directions are arranged to be different, in this way, for multiple distances from the centers of the two first sub-pixels and the centers of the two third sub-pixels in the virtual quadrilateral to a center of the second sub-pixel, at least two distances among the multiple distances are different, so that brightness centers of virtual pixels are arranged more uniformly, avoiding graininess and distortion of the display and improving display effect. In addition, without the need of moving positions of the sub-pixels, the brightness centers of the virtual pixels are moved, which has a low implementation cost.

DETAILED DESCRIPTION

To make objectives, technical solutions, and advantages of embodiments of the present disclosure clearer, the technical solutions of the embodiments of the present disclosure will be clearly and completely described hereinafter with reference to the accompanying drawings of the embodiments of the present disclosure. The described embodiments are a part rather than all of the embodiments of the present disclosure. Based on the described embodiments of the present disclosure, all other embodiments obtained by those skilled in the art fall within the protection scope of the present disclosure.

Figure 1:
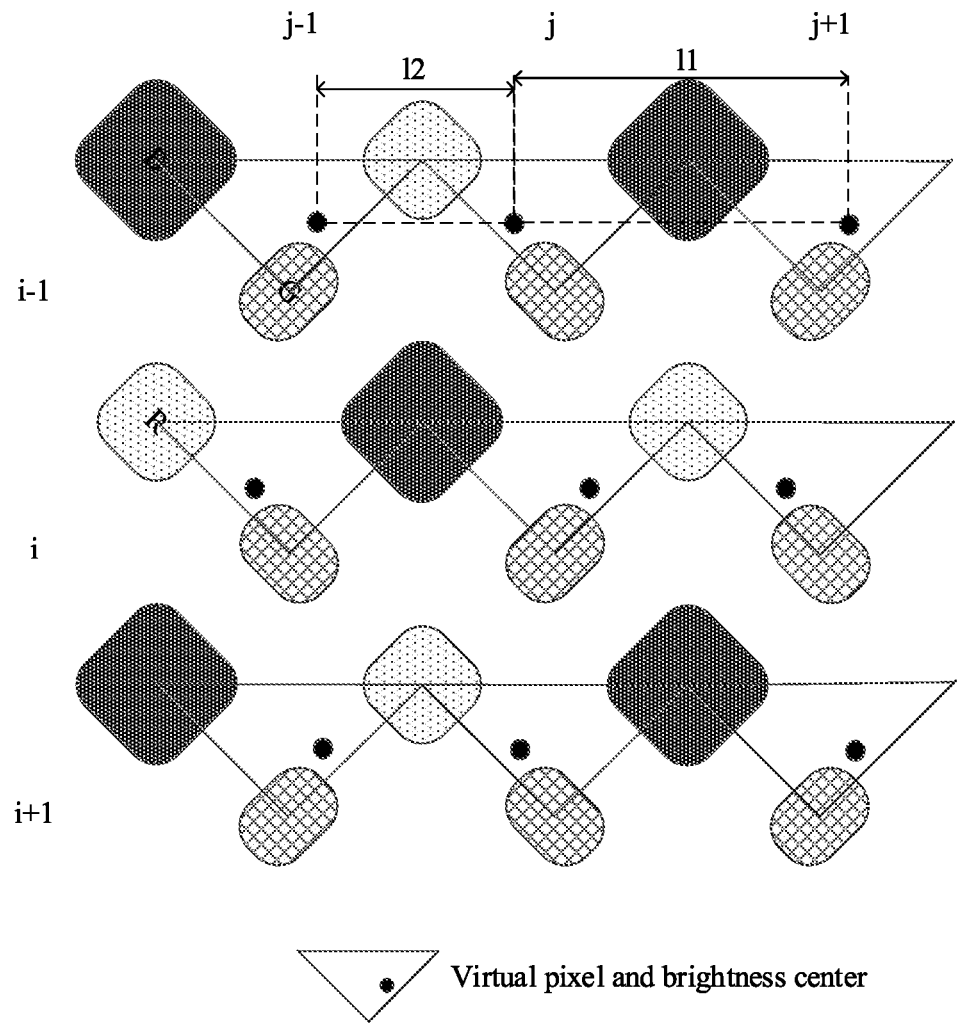
FIG. 1 is a schematic diagram of a pixel arrangement structure in the related technologies.

Reference is made to FIG. 1. FIG. 1 is a schematic diagram of a pixel arrangement structure in the related technologies. In FIG. 1, blue sub-pixels (B) and red sub-pixels (R) are square. In this structure, in the (i−1)-th row, a distance 11 between brightness centers of virtual pixel in the j-th column and the virtual pixel in the (j+1)-th column (the black dots in the figure) is greater than a distance 12 between brightness centers of the virtual pixel in the j-th column and the virtual pixel in the (j−1)-th column; in the i-th row, a distance between brightness centers of the virtual pixel in the j-th column and the virtual pixel in the (j+1)-th column (the black dots in the figure) is smaller than a distance between brightness centers of the virtual pixel in the j-th column and the virtual pixel in the (j−1)-th column; which results in a perceptible sense of distortion and graininess to human eyes when displaying vertical lines or an image dominated by vertical lines.

Figure 2:
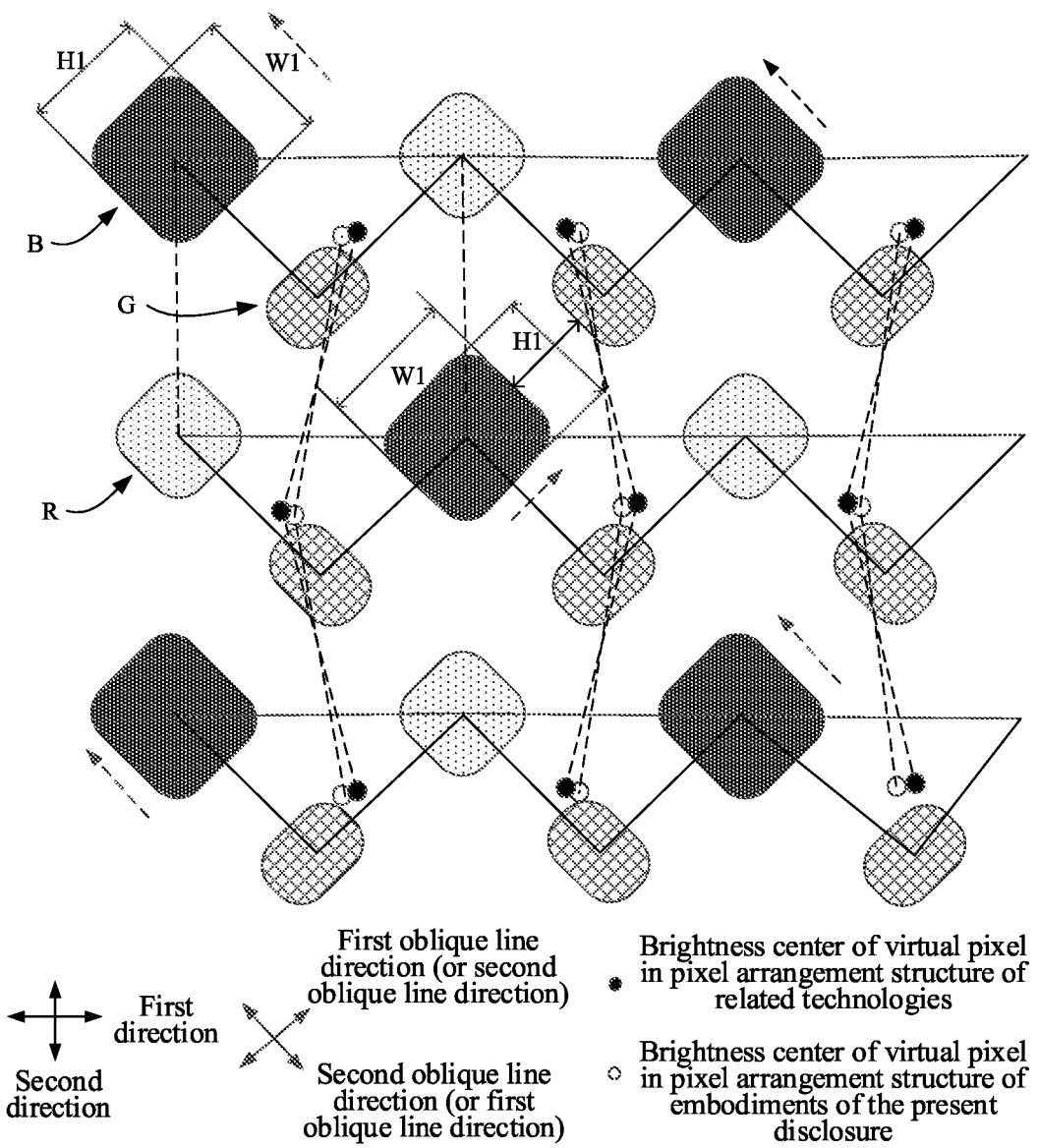
FIG. 2 is a schematic diagram of a display substrate according to embodiments of the present disclosure.

In order to solve the above problem, reference is made to FIG. 2. Embodiments of the present disclosure provide a display substrate, including: first sub-pixels R, second sub-pixels G, and third sub-pixels B.

In a first direction, the first sub-pixels R and the third sub-pixels B are alternately arranged to form first sub-pixel rows, and the second sub-pixels G form second sub-pixel rows.

In a second direction, the first sub-pixel rows and the second sub-pixel rows are alternately arranged, and the first direction and the second direction are perpendicular or substantially perpendicular.

Two first sub-pixels R and two third sub-pixels B distributed in two adjacent rows and two adjacent columns form a 2*2 array. In the 2*2 array, the two first sub-pixels R are located in different rows and in different columns, the two third sub-pixels B are located in different rows and in different columns, connection lines of centers of the two first sub-pixels R and the two third sub-pixels B form a virtual quadrilateral, and the sub-pixel G is located within the virtual quadrilateral.

For multiple distances from the centers of the two first sub-pixels R and the centers of the two third sub-pixels B corresponding to the same virtual quadrilateral to the center of the second sub-pixel G, at least two distances among the multiple distances are different.

The third sub-pixel B has a symmetry axis along a first oblique line direction and a symmetry axis along a second oblique line direction. The width of the third sub-pixel B in the first oblique line direction is different from that in the second oblique line direction (one of the widths is W1 and the other of the widths is H1), the second oblique line direction is perpendicular or substantially perpendicular to the first oblique line direction, and the second oblique line direction and the first oblique line direction intersect both the first direction and the second direction.

It can be seen from FIG. 2 that, the first sub-pixel R and third sub-pixel B which are adjacent and are in a same row, and a second sub-pixel G in the next row, form a virtual pixel (the triangle in the figure). Moreover, adjacent virtual pixels in a same row share a first sub-pixel R or a third sub-pixel B.

In addition, it can also be seen from FIG. 2 that, in the embodiments of the present disclosure, a difference of distances each of which is between brightness centers of adjacent virtual pixels in a same row is smaller than a difference of distances each of which is between brightness centers of adjacent virtual pixels in a same row in the related technologies. That is, the arrangement of the brightness centers of the virtual pixels in the embodiments of the present disclosure is more uniform.

In the embodiments of the present disclosure, on the one hand, by sharing sub-pixels, higher resolution can be achieved; on the other hand, the widths of the third sub-pixel in different oblique line directions are arranged to be different, in this way, for multiple distances from the centers of the two first sub-pixels and the centers of the two third sub-pixels in the virtual quadrilateral to a center of the second sub-pixel, at least two distances among the multiple distances are different, so that the brightness centers of the virtual pixels are more uniform, avoiding graininess and distortion of the display and improving display effect. In addition, without the need of shifting positions of the sub-pixels, the brightness centers of the virtual pixels are shifted, which has a low implementation cost.

In the embodiments of the present disclosure, optionally, for the multiple distances from the centers of the two first sub-pixels and the centers of the two third sub-pixels in the same virtual quadrilateral to the center of the second sub-pixel, at least two distances among the multiple distances are the same.

In the embodiments of the present disclosure, optionally, a range of an interior angle of the virtual quadrilateral is 70°-120°.

In the embodiments of the present disclosure, optionally, two first sub-pixels and two third sub-pixels corresponding to a same virtual quadrilateral surround a second sub-pixel; a minimum distance among distances that are from other first sub-pixels and other third sub-pixels outside this virtual quadrilateral, is greater than, a minimum distance among distances that are from the two first sub-pixels and the two third sub-pixels corresponding to this virtual quadrilateral to the surrounded second sub-pixel. The distance may be a distance between boundaries of sub-pixels. In addition, if patterns of the sub-pixels have rounded corners, the distance between the rounded corners may be partially deviated. Therefore, the error caused by the rounded corners, or the measurement error, needs to be considered for the distance, for example, for a deviation of about 3 microns, it is regarded as equivalent.

In the embodiments of the present disclosure, optionally, for the multiple distances that are from the centers of the two first sub-pixels and the centers of the two third sub-pixels corresponding to a same virtual quadrilateral to the center of the second sub-pixel, a ratio of any two distances among the multiple distances is in a range of 0.7 to 1.3

In the embodiments of the present disclosure, optionally, a difference between the distances from the centers of the two first sub-pixels to the center of the second sub-pixel corresponding to a same virtual quadrilateral, is smaller than, a difference between the distances from the centers of the two third sub-pixels to the center of the second sub-pixel corresponding to the same virtual quadrilateral.

Further optionally, for same virtual quadrilateral, the distances from the centers of the two first sub-pixels to the center of the second sub-pixel are equal or substantially equal.

In the embodiments of the present disclosure, optionally, a difference between the distances from the centers of the two first sub-pixels to the center of the second sub-pixel corresponding to a same virtual quadrilateral, is smaller than, a difference between the distances from the centers of the two third sub-pixels to the center of the second sub-pixel corresponding to the same virtual quadrilateral.

Optionally, each of the distances from the centers of the two first sub-pixels and the centers of the two third sub-pixels corresponding to a same virtual quadrilateral to the center of the second sub-pixel ranges from 20 μm to 60 μm. Further, optionally, each of the distances from the centers of the two first sub-pixels and the centers of the two third sub-pixels corresponding to a same virtual quadrilateral to the center of the second sub-pixel ranges from 25 to 50 μm, or, 30 to 48 μm.

In the embodiments of the present disclosure, optionally, the first sub-pixel and the third sub-pixel have different shapes. For example, one of them is a square and the other is an oblong; or, the first sub-pixel and the third sub-pixel are both oblongs, but their length-width ratios are different.

In the embodiments of the present disclosure, optionally, when the first sub-pixel and/or the third sub-pixel are oblong, the length-width ratio may be 1.2 to 1.8.

In the embodiments of the present disclosure, optionally, a length-width ratio of the second sub-pixel may be 1.2 to 1.3.

In the embodiments of the present disclosure, optionally, the first sub-pixel and the third sub-pixel each are an axisymmetric pattern, and a symmetry axis of at least one first sub-pixel and a symmetry axis of at least one third sub-pixel are parallel and do not coincide; and/or, the first sub-pixel has a symmetry axis in a first oblique direction, and symmetry axes in the first oblique direction of two adjacent first sub-pixels in the first oblique direction do not coincide; and/or, the third sub-pixel has a symmetry axis in a the oblique direction, and symmetry axes in the first oblique direction of two adjacent third sub-pixels in the first oblique direction do not coincide.

As mentioned in the above embodiments, in the virtual quadrilateral, for multiple distances from the centers of the two first sub-pixels R and the centers of the two third sub-pixels B to the center of the second sub-pixel G, at least two distances among the multiple distances are different. Descriptions are provided in the following with examples.

Figure 3:
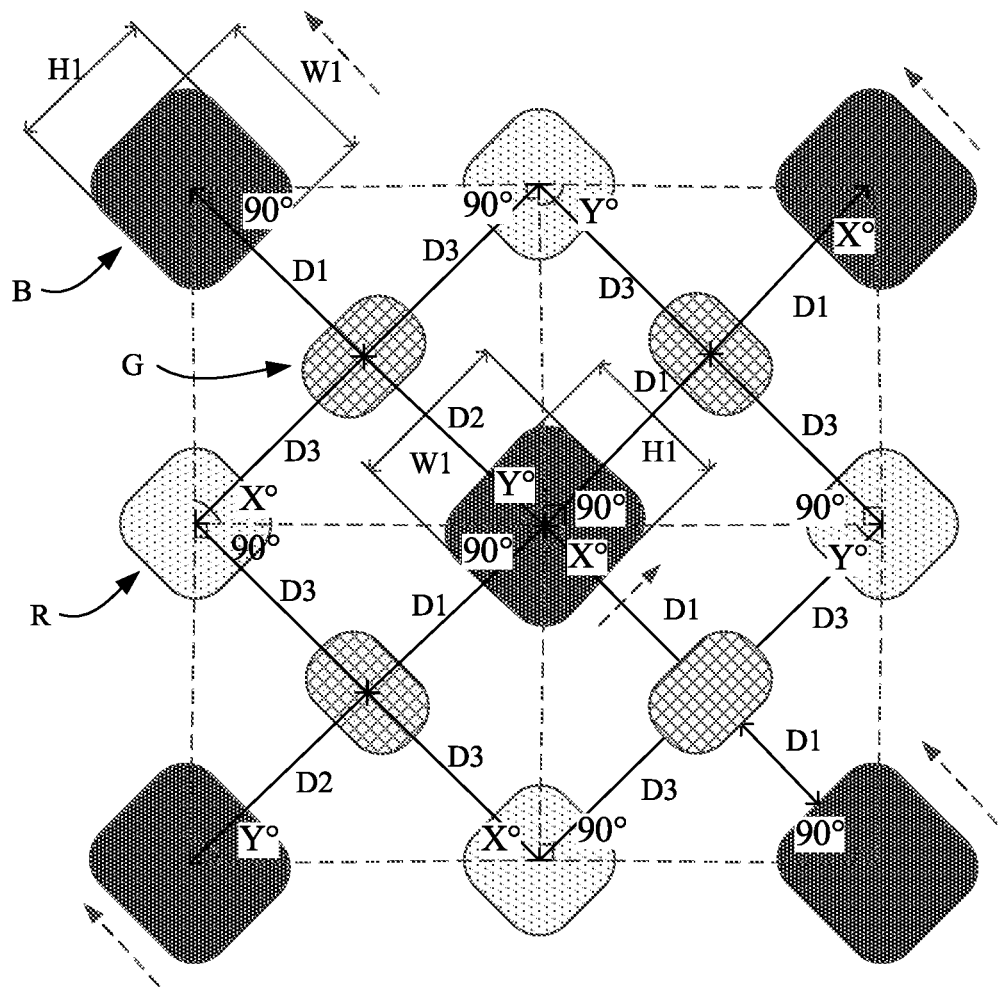
FIGS. 3 and 5 are schematic diagrams of a display substrate according to a first embodiment of the present disclosure.

In some embodiments of the present disclosure, optionally, reference is made to FIG. 3. In a first embodiment of the present disclosure, in at least one of the virtual quadrilaterals (see the two virtual quadrilaterals on the left side of FIG. 3), the distance D1 between the center of the second sub-pixel G and the center of the first one of the third sub-pixels B is different from the distance D2 between the center of the second sub-pixel G and the center of the second one of the third sub-pixels B; the distance between the center of the second sub-pixel G and the center of the first one of the first sub-pixels R is approximately equal to the distance between the center of the second sub-pixel G and the center of the second one of the first sub-pixels R, which both are D3. Optionally, D2 is greater than D1. Optionally, D1 is greater than D3.

Figure 4:
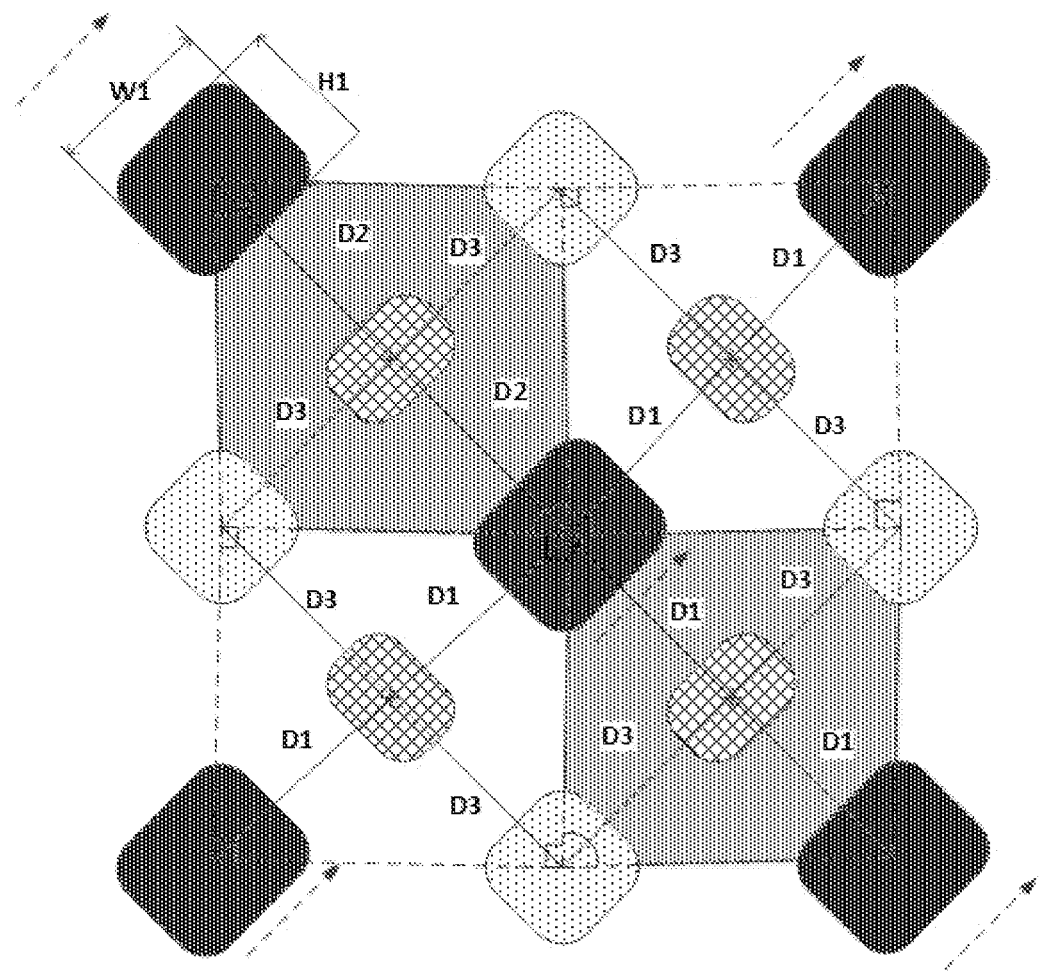
FIGS. 4 and 6 are schematic diagrams of a display substrate according to a second embodiment of the present disclosure.

In some embodiments of the present disclosure, optionally, reference is made to FIGS. 3 and 4. In at least one of the virtual quadrilaterals (see the two virtual quadrilaterals on the right side of FIG. 3 and the virtual quadrilaterals in FIG. 4), the distance from the center of the second sub-pixel to the centers of the two third sub-pixels are approximately equal, which both are D1 or D2; and the distances from the center of the second sub-pixel to the centers of the two first sub-pixels are approximately equal, which both are D3. Optionally, D2 is greater than D1. Optionally, D1 is greater than D3.

In the first embodiment shown in FIG. 3, the third sub-pixels B located in the same row have the same width in the first oblique line direction (that is, directions of their long sides are the same), the third sub-pixels B located in the same column have the same width in the first oblique line direction (that is, directions of their long sides are the same), and the third sub-pixels B located in adjacent rows and adjacent columns have different widths in the first oblique direction (that is, directions of their long sides are perpendicular or substantially perpendicular to each other, and the direction of the long side in FIG. 3 is indicated by a dashed arrow).

In a second embodiment shown in FIG. 4, all the third sub-pixels B have the same width in the first oblique line direction (that is, directions of their long sides are the same, and the direction of the long side in FIG. 4 is indicated by a dotted arrow).

In the embodiments shown in FIGS. 3 and 4, the first sub-pixels R and the third sub-pixels B located in the same row are not on a same straight line, and the first sub-pixels R and the third sub-pixels B located in the same column are not on a same straight line.

In the embodiments of the present disclosure, four virtual quadrilaterals arranged in an array form a virtual polygon (it may be a virtual quadrilateral or a virtual octagon, etc.), and the first sub-pixels and the third sub-pixels are located on corners or edges of the virtual polygon, and are alternately distributed on the edges or the corners of the virtual polygon in a clockwise direction.

In the embodiments of the present disclosure, in the virtual polygon, the centers of the third sub-pixels located in a same row are approximately on a straight line parallel to a row direction, and/or the centers of the third sub-pixels located in a same column are approximately on a straight line parallel to a column direction.

In the embodiments of the present disclosure, in the virtual polygon, the centers of the second sub-pixels located in a same row are approximately on a straight line parallel to a row direction, and/or the centers of the second sub-pixels located in a same column are approximately on a straight line parallel to a column direction.

In the embodiments shown in FIGS. 3 and 4, four virtual quadrilaterals arranged in an array form a virtual octagon, and the virtual octagon serves as a repeating unit. The centers of four first sub-pixels R and four third sub-pixels B are located at vertices of the virtual octagon, and the first sub-pixels R and the third sub-pixels B are alternately arranged clockwise. One of the third sub-pixels B is located in the center of the virtual octagon.

Figure 5:
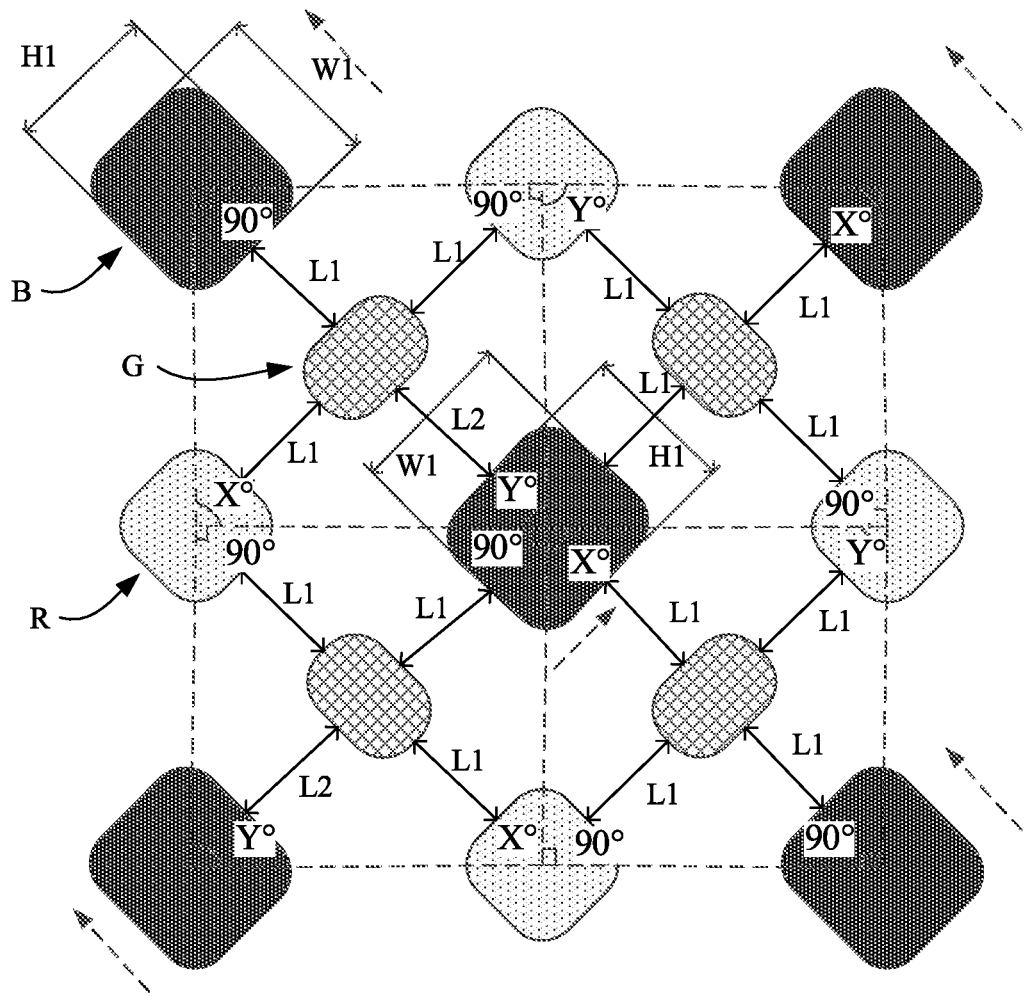
Figure 6:
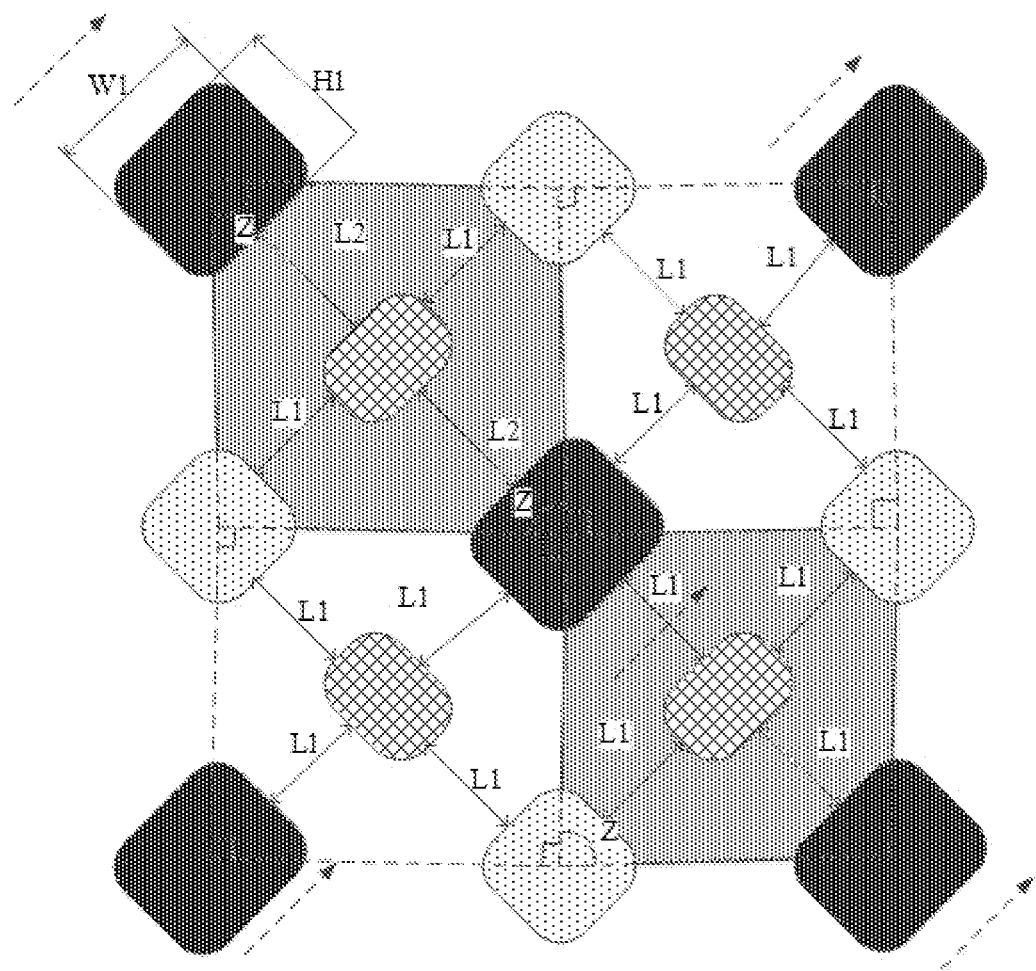

In the embodiments of the present disclosure, optionally, for the virtual quadrilateral, the second sub-pixel G is approximately symmetrical with respect to a connection line of the centers of the third sub-pixels B that are adjacently arranged in the first oblique line direction or the second oblique line direction. That is, the second sub-pixel G is on a symmetry axis of two third sub-pixels B. Optionally, as shown in FIG. 5, for one of the third sub-pixels B, a width in a direction of the symmetry axis is smaller than a width in a direction of the other symmetry axis; for the other of the third sub-pixels B, a width in the direction of the symmetry axis is greater than a width in the direction of the other symmetry axis (that is, the long sides of the two third sub-pixels B of the virtual quadrilateral are perpendicular or approximately perpendicular). Or, as shown in FIG. 6, for each of the two third sub-pixels B, a width in a direction of the symmetry axis is smaller than a width in a direction of the other symmetry axis (that is, the long sides of the two third sub-pixels B of the virtual quadrilateral are parallel).

For different circumstances in the above embodiments, distances between the sub-pixels of the virtual quadrilateral are changed; there exist at least some virtual quadrilaterals in which distances from the two third sub-pixels B to the second sub-pixel G are different. Description are provided in the following with examples.

A distance between sub-pixels refers to a vertical distance between two adjacent parallel edges of the sub-pixels.

In some embodiments of the present disclosure, optionally, reference is made to FIG. 5. In at least one of the virtual quadrilaterals (the two virtual quadrilaterals on the left of FIG. 5), the distance between the second sub-pixel G and the first one of the third sub-pixels B is L1, the distance between the second sub-pixel G and the second one of the third sub-pixels B is L2, and the distances from the second sub-pixel G to the two first sub-pixels R are both L1, where L2 is greater than L1.

In some embodiments of the present disclosure, optionally, reference is made to FIG. 5 and FIG. 6. In at least one of the virtual quadrilaterals, each of the distances from the second sub-pixel G to the two third sub-pixels B and the two first sub-pixels R is L1 (the two virtual quadrilaterals on the right side of FIG. 5, and the three virtual quadrilaterals except for the one on the upper left corner of FIG. 6) or L2 (not shown), where L2 is greater than L1.

In some embodiments of the present disclosure, optionally, reference is made to FIG. 6 (the virtual quadrilateral in the upper left corner of FIG. 6). In at least one of the virtual quadrilaterals, the distance from the second sub-pixel G to the two third sub-pixels B are both L2, and the distances from the second sub-pixel G to the two first sub-pixels R are both L1, where L2 is greater than L1.

In the above embodiments, optionally, a difference between L2 and L1 is greater than or equal to 1 µm, and further optionally, the difference between L2 and L1 is greater than or equal to 2 µm or 3 µm.

In the above embodiments, optionally, a range of L1 is 12-30 m, further optionally, the range of L1 is 14-28 µm, and further optionally, the range of L1 is 16-26 µm.

In the embodiments of the present disclosure, optionally, a range of each of all interior angles of the virtual quadrilateral is 700 to 120°. Further optionally, the interior angles of the virtual quadrilateral include at least one obtuse angle or at least one acute angle.

In the embodiments of the present disclosure, optionally, reference is made to FIGS. 3 and 5. The virtual quadrilateral is a right-angled trapezoid, two interior angles thereof each are 90°, and one of the other two interior angles thereof is an obtuse angle which is X°, and one of the other two interior angles thereof is an acute angle which is Y°. The range of obtuse angle is greater than 900 and less than or equal to 100°, further optionally, being 91°-96°. The range of acute angle is greater than or equal to 80° and less than 90°, and further optionally, being 84°-89°.

It can be seen from FIGS. 3 and 5 that, after a virtual quadrilateral is rotated 90°+X° or rotated 90°+Y° around the center of the third sub-pixel located in the center of the virtual octagon, it may coincide with a diagonal virtual quadrilateral.

In the embodiments of the present disclosure, optionally, some of the virtual quadrilaterals each are a first parallelogram, and some of the virtual quadrilaterals each are a second parallelogram. In a row direction and a column direction, the first parallelograms and the second parallelograms are arranged alternately; and interior angles of the first parallelogram and interior angles the second parallelogram are different. At least one interior angle of the first parallelogram and at least one interior angle of the second parallelogram are different; four interior angles of the first parallelogram may be different from four interior angles of the second parallelogram, or, an interior angle of the four interior angles of the first parallelogram and an interior angle of the four interior angles of the second parallelogram may have the same value in degrees but have different orientations. The orientations being different means that, at least one of two edges forming a first interior angle and at least one of two edges forming a second interior angle are not parallel.

Optionally, the second parallelogram may be a rectangle. The rectangle include an oblong or a square.

In the embodiments of the present disclosure, optionally, reference is made FIGS. 4 and 6, where some of the virtual quadrilaterals are parallelograms, and some of the virtual quadrilaterals are squares. In the row direction and the column direction, the parallelograms and the squares are arranged alternately.

In the embodiments of the present disclosure, optionally, a range of each of an acute angle Z of the first parallelogram and an acute angle of the second parallelogram is greater than or equal to 700 and less than 90°, and further optionally, being 84°-89°.

As can be seen from FIGS. 4 and 6, in a virtual octagon, two diagonal virtual quadrilaterals are parallelograms, other two diagonal virtual quadrilaterals are squares, the two squares are the same, and the two parallelograms are different.

In the above embodiments, optionally, for the third sub-pixel, a difference between its width in the first oblique line direction and its width in the second oblique line direction is greater than or equal to 1 μm, and further optionally, being greater than or equal to 3 μm.

In the above embodiments, optionally, the first sub-pixel R has a square shape.

In the embodiments of the present disclosure, optionally, a certain width of the third sub-pixel B in the first oblique line direction or the second oblique line direction is removed from the third sub-pixel B (the blank region on a side of the third sub-pixel B in the figure is the removed region), to change the shape of the third sub-pixel B, so as to realize that: for multiple distances from the centers of the two first sub-pixels R and the centers of the two third sub-pixels B in the virtual quadrilateral to the second sub-pixel G, at least two differences among the multiple distances are different.

Figure 7:
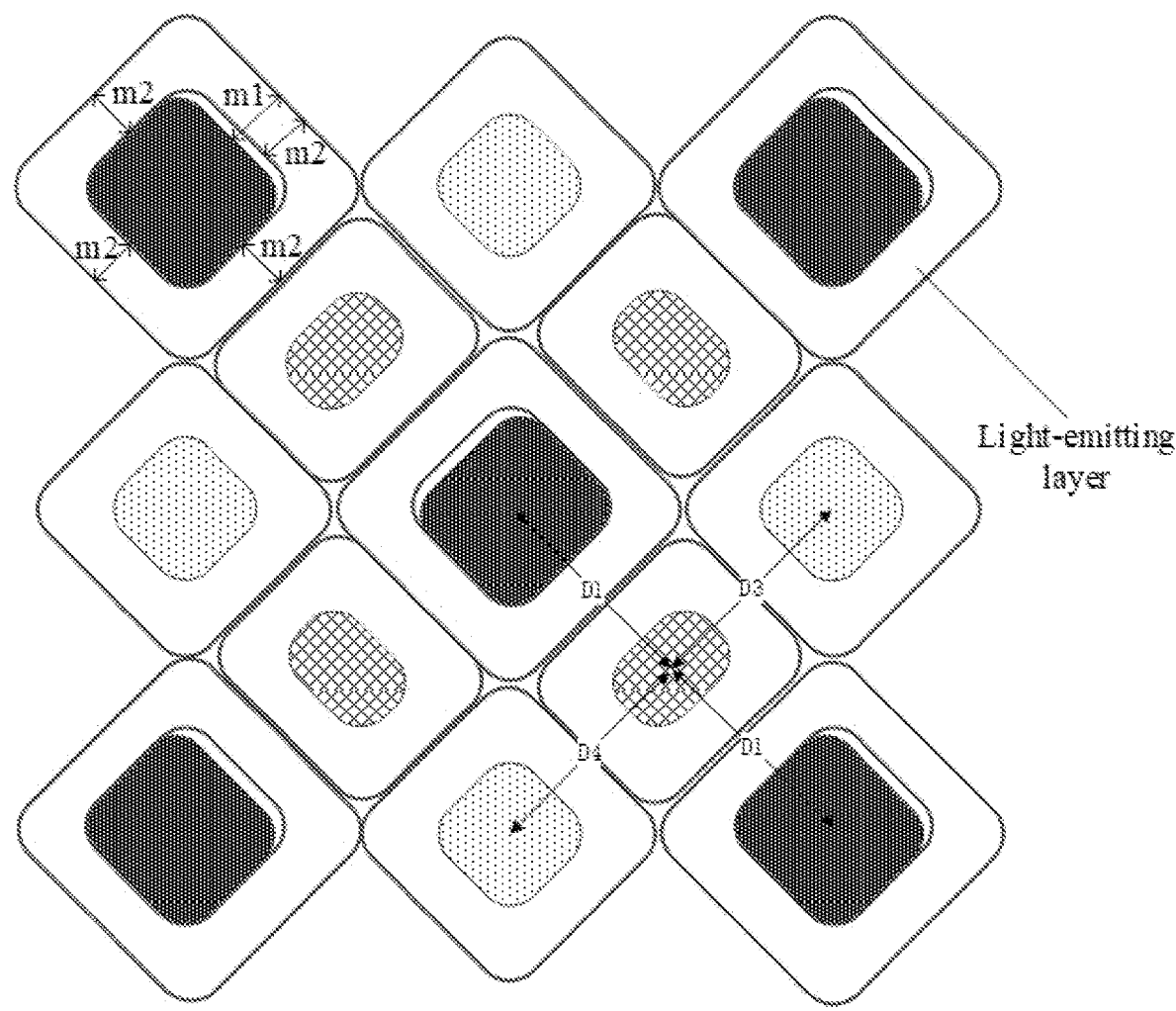
FIG. 7-13 are schematic diagrams of a positional relationship between a display substrate and opening regions of a light-emitting layer according to embodiments of the present disclosure.
Figure 8:
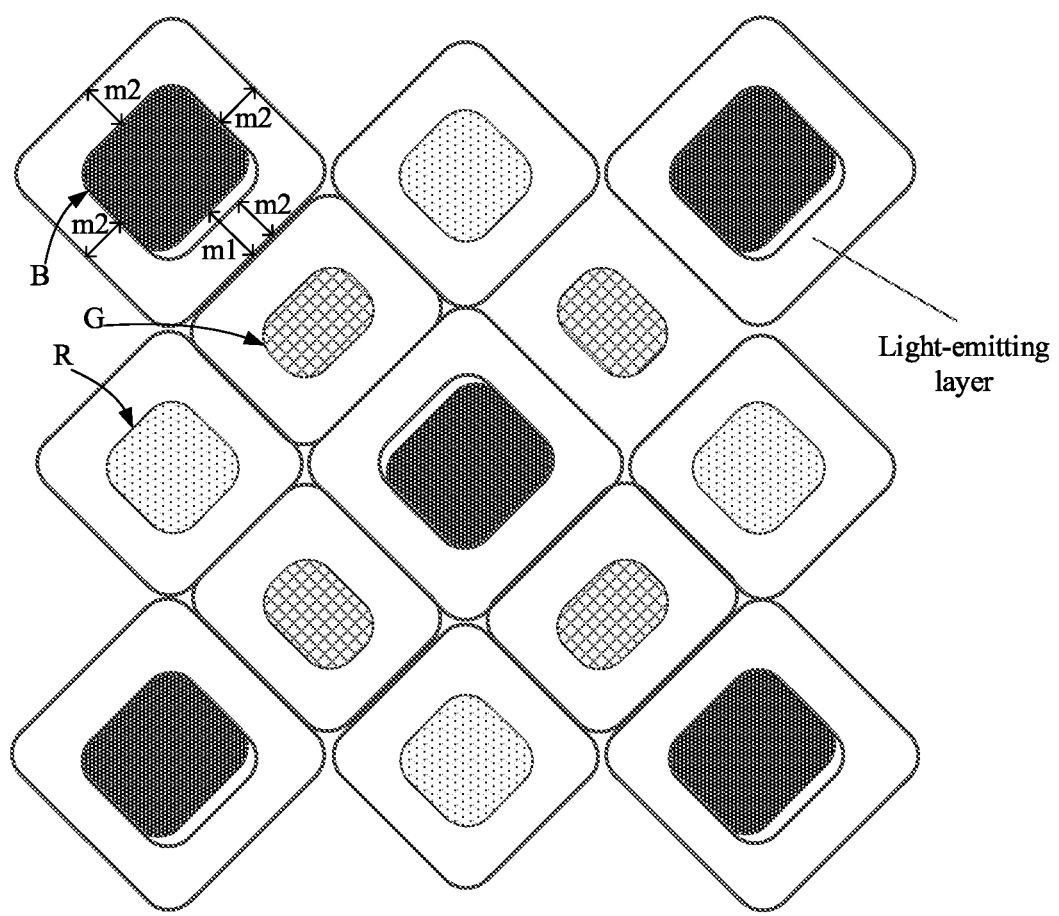
Figure 9:
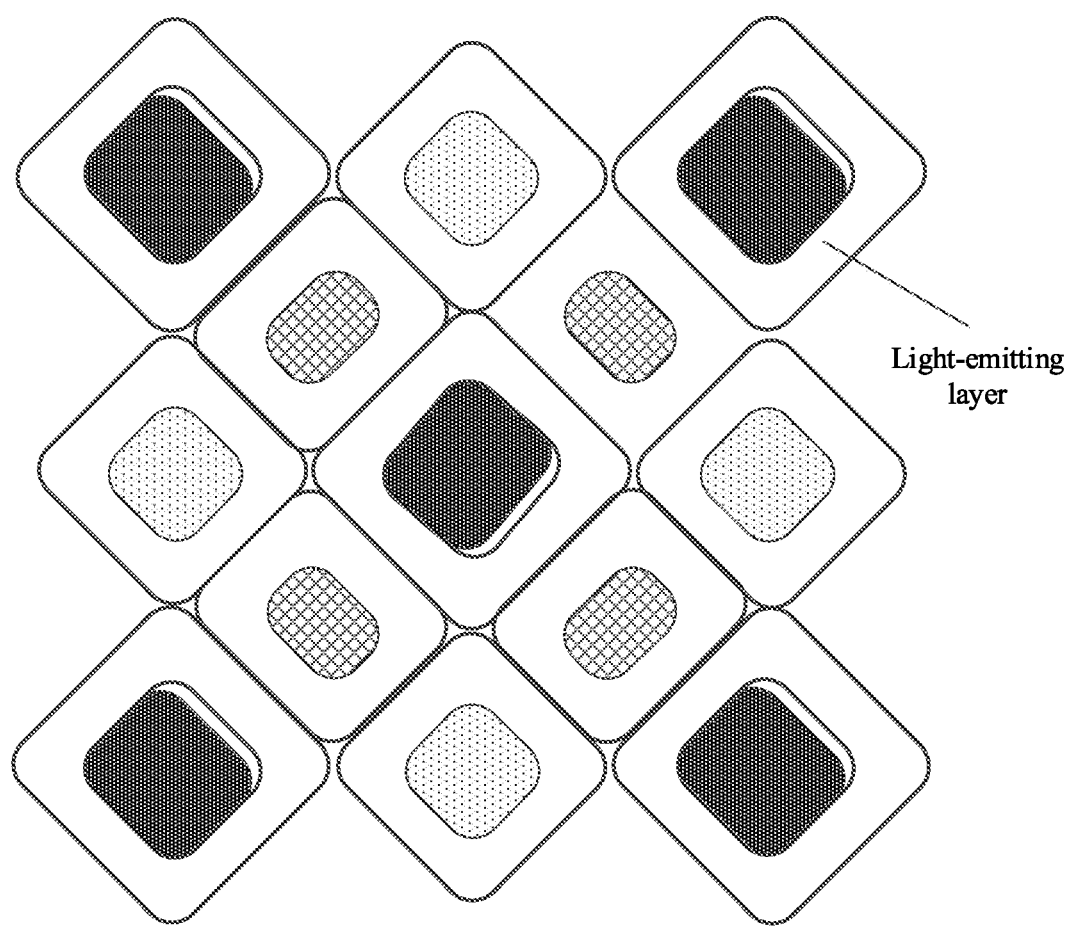
Figure 10:
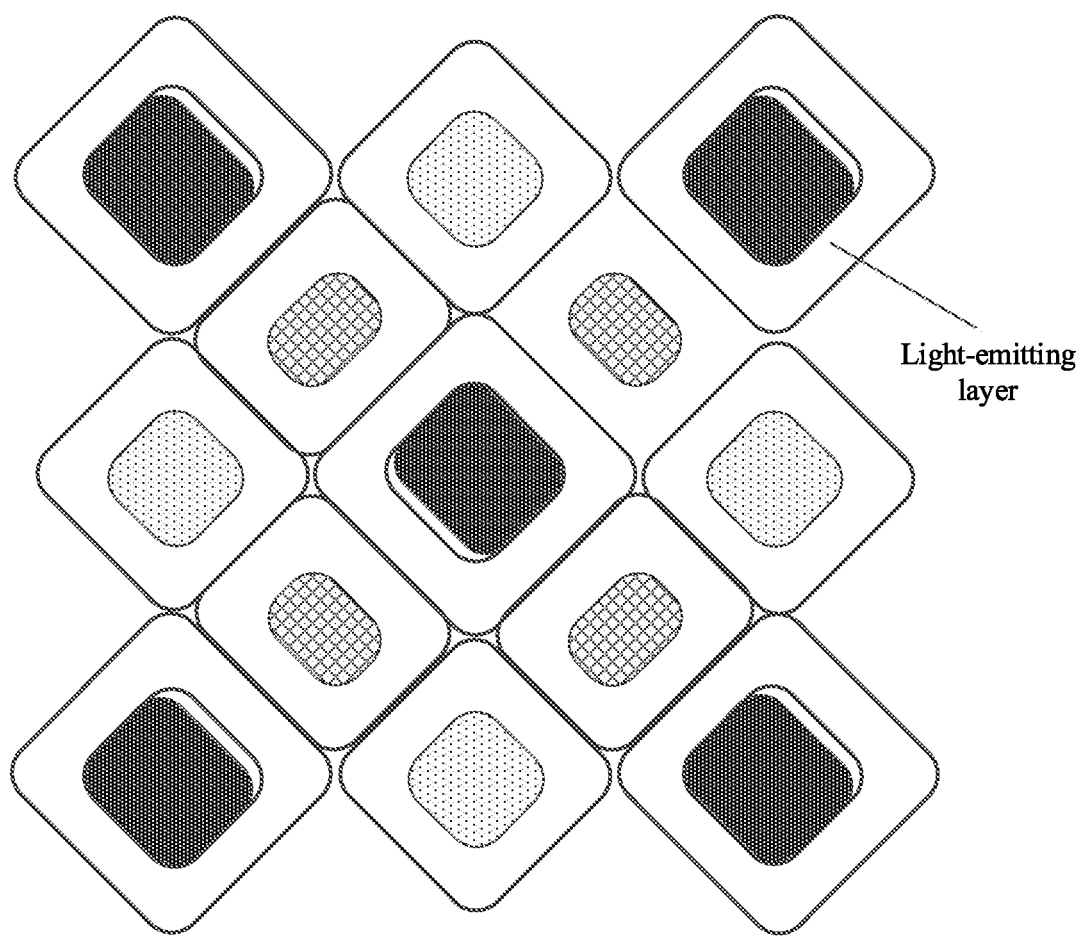
Figure 11:
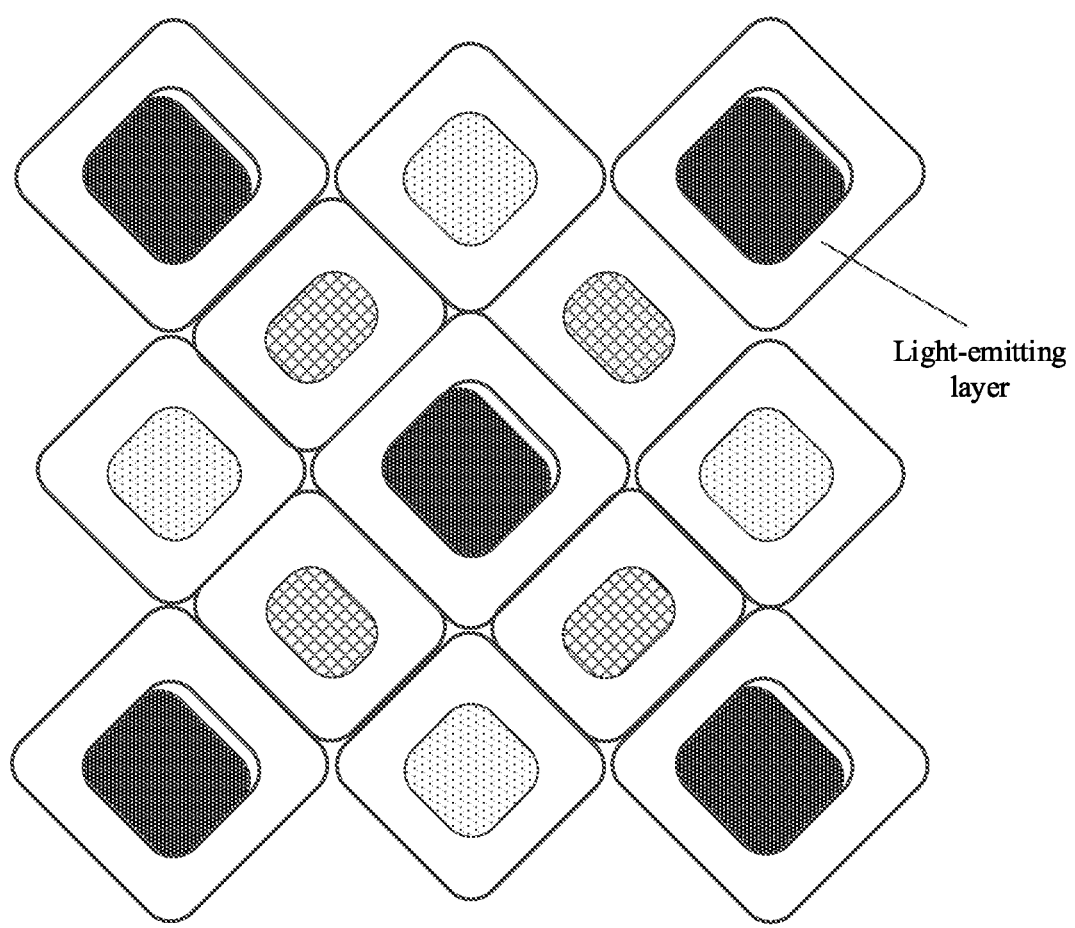
Figure 12:
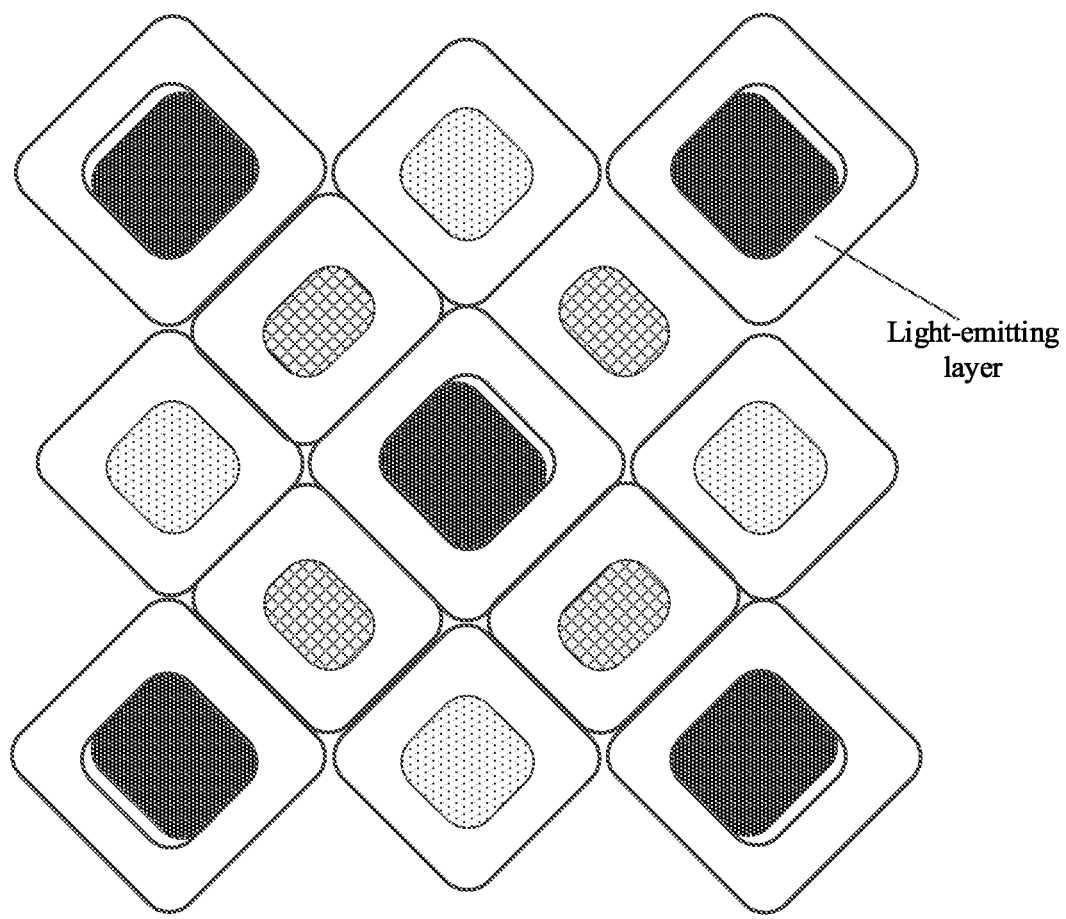
Figure 13:
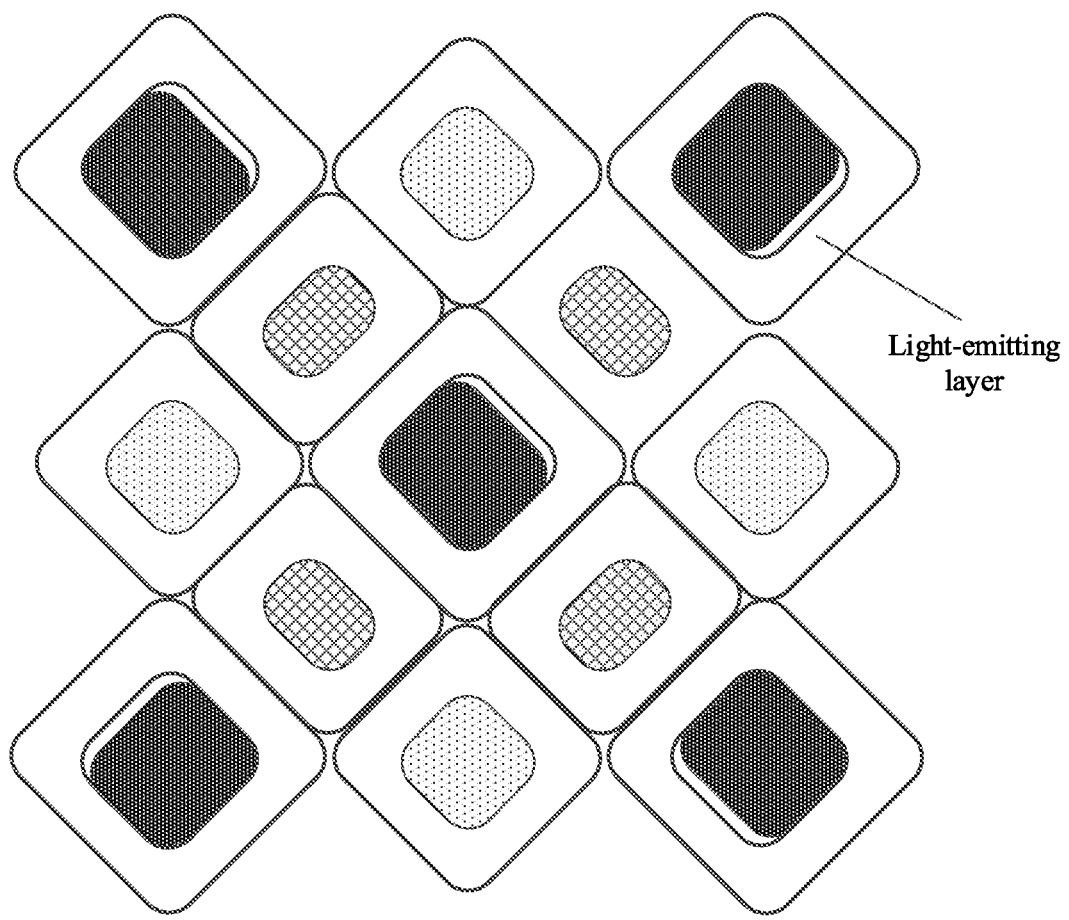

Please refer to FIGS. 7 and 8, frames around the first sub-pixel R, the second sub-pixel G, and the third sub-pixel B are opening regions of the light-emitting layer. After a certain width of part in the first oblique line direction or the second oblique line direction is removed from the third sub-pixel B, a distance between an edge where the certain width of part is removed and the boundary of the opening region of the peripheral light-emitting layer is m1, which is greater than a distance m2 between each of other edges and the boundary of the opening region of the peripheral light-emitting layer.

The above embodiments are only examples. In a virtual octagon, for each third sub-pixel B, the edge where the certain width of part is removed is not limited thereto, various combinations may be made, and reference is made to FIGS. 9-13. Referring to FIGS. 7-13, for a third sub-pixel B, a certain width of part may be removed at any of: the two edges perpendicular to the first oblique line direction and the two edges parallel to the first oblique line direction.

Figure 14:
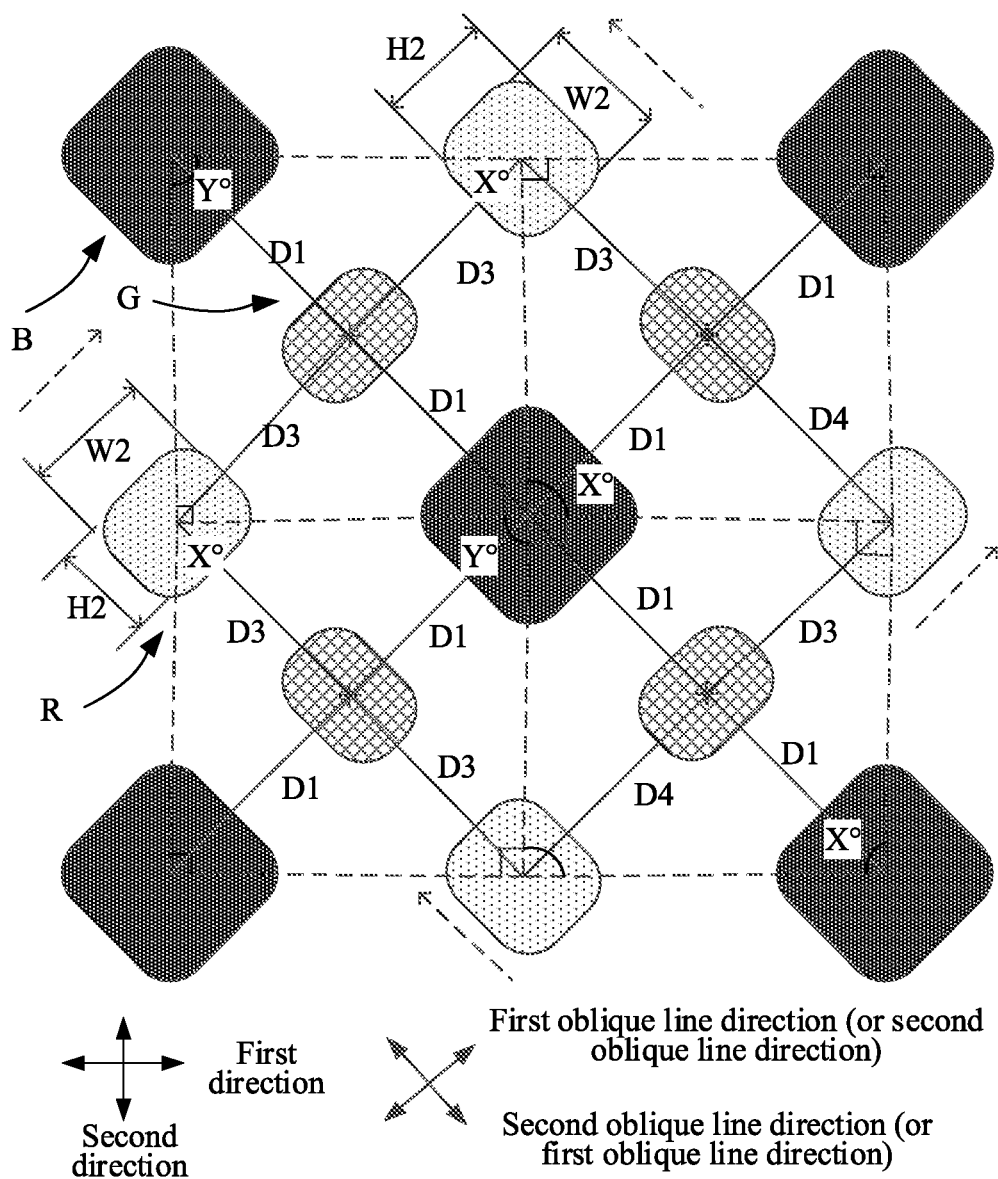
FIG. 14-15 are schematic diagrams of a display substrate according to a third embodiment of the present disclosure.

Referring to FIG. 14, a third embodiment of the present disclosure provides a display substrate, including: first sub-pixels R, second sub-pixels G, and third sub-pixels B.

In a first direction, the first sub-pixels R and the third sub-pixels B are alternately arranged to form first sub-pixel rows, and the second sub-pixels G form second sub-pixel rows.

In a second direction, the first sub-pixel rows and the second sub-pixel rows are alternately arranged, and the first direction and the second direction are perpendicular or substantially perpendicular.

Two first sub-pixels R and two third sub-pixels B distributed in two adjacent rows and two adjacent columns form a 2*2 array. In the 2*2 array, the two first sub-pixels R are located in different rows and in different columns, the two third sub-pixels B are located in different rows and in different columns, connection lines of centers of the two first sub-pixels R and the two third sub-pixels B form a virtual quadrilateral, and the sub-pixel G is located within the virtual quadrilateral.

For multiple distances from the centers of the two first sub-pixels R and the centers of the two third sub-pixels B corresponding to the same virtual quadrilateral to the center of the second sub-pixel G, at least two distances among the multiple distances are different.

The first sub-pixel R has a symmetry axis along a first oblique line direction and a symmetry axis along a second oblique line direction. The width of the first sub-pixel R in the first oblique line direction is different from that in the second oblique line direction (one of the widths is W2 and the other of the widths is H2), the second oblique line direction is perpendicular or substantially perpendicular to the first oblique line direction, and the second oblique line direction and the first oblique line direction intersect both the first direction and the second direction.

It can be seen from FIG. 14 that, the first sub-pixel R and third sub-pixel B which are adjacent and are in a same row, and a second sub-pixel G in the next row, form a virtual pixel (the triangle in the figure). Moreover, adjacent virtual pixels in a same row share a first sub-pixel R or a third sub-pixel B.

In the embodiments of the present disclosure, on the one hand, by sharing sub-pixels, higher resolution can be achieved; on the other hand, the widths of the first sub-pixel in different oblique line directions are arranged to be different, in this way, for multiple distances from the centers of the two first sub-pixels and the centers of the two third sub-pixels in the virtual quadrilateral to a center of the second sub-pixel, at least two distances among the multiple distances are different, so that the brightness centers of the virtual pixels are more uniform, avoiding graininess and distortion of the display and improving display effect. In addition, without the need of changing positions of the sub-pixels, the brightness centers of the virtual pixels are changed, which has a low implementation cost.

As mentioned in the above embodiments, in the virtual quadrilateral, for multiple distances from the centers of the two first sub-pixels R and the centers of the two third sub-pixels B to the center of the second sub-pixel G, at least two distances among the multiple distances are different. Descriptions are provided in the following with examples.

In some embodiments of the present disclosure, optionally, reference is made to FIG. 7 (two virtual quadrilaterals on the right side of FIG. 7). In at least one of the virtual quadrilaterals, the distance between the center of the second sub-pixel G and the center of the first one of the third sub-pixels B is approximately equal to the distance between the center of the second sub-pixel G and the center of the second one of the thirds sub-pixel B, which both are D1; and the distance D3 between the center of the second sub-pixel G and the center of the first one of the first sub-pixels R is different from the distance D4 between the center of the second sub-pixel G and the center of the second one of the first sub-pixels R.

In some embodiments of the present disclosure, optionally, reference is made to FIG. 14. In at least one of the virtual quadrilaterals (the two virtual quadrilaterals on the left side of FIG. 14), the distance between the center of the second sub-pixel G and the center of the first one of the third sub-pixels B is approximately equal to the distance between the center of the second sub-pixel G and the center of the second one of the third sub-pixels B, which both are D1; and the distance between the center of the second sub-pixel G and the center of the first one of the first sub-pixels R is approximately the same as the distance between the center of the second sub-pixel G and the center of the second one of the first sub-pixels R, which both are D3.

In the third embodiment shown in FIG. 14, the first sub-pixels R located in the same row have the same width in the first oblique line direction (that is, directions of their long sides are the same), the first sub-pixels R located in the same column have the same width in the first oblique line direction (that is, directions of their long sides are the same), and the first sub-pixels R located in adjacent rows and adjacent columns have different widths in the first oblique direction (that is, directions of their long sides are perpendicular or substantially perpendicular to each other, and the direction of the long side in FIG. 14 is indicated by a dashed arrow).

In some other embodiments of the present disclosure, optionally, for all the first sub-pixels R, their widths in the first oblique line direction are the same (that is, the directions of their long sides are the same).

In the embodiments shown in FIG. 14 above, the first sub-pixels R and the third sub-pixels B located in the same row are not on the same straight line, and the first sub-pixels R and the third sub-pixels B located in the same column are not on a same straight line.

In the embodiments of the present disclosure, four virtual quadrilaterals arranged in an array form a virtual polygon (it may be a virtual quadrilateral or a virtual octagon, etc.), and the first sub-pixels and the third sub-pixels are located on corners or edges of the virtual polygon, and are alternately distributed on the edges or the corners of the virtual polygon in a clockwise direction.

In the embodiments of the present disclosure, in the virtual polygon, the centers of the third sub-pixels located in a same row are approximately on a straight line parallel to a row direction, and/or the centers of the third sub-pixels located in a same column are approximately on a straight line parallel to a column direction.

In the embodiments of the present disclosure, in the virtual polygon, the centers of the second sub-pixels located in a same row are approximately on a straight line parallel to a row direction, and/or the centers of the second sub-pixels located in a same column are approximately on a straight line parallel to a column direction.

In the embodiments shown in FIG. 14, four virtual quadrilaterals arranged in an array form a virtual octagon, and the virtual octagon serves as a repeating unit. The centers of four first sub-pixels R and four third sub-pixels B are located at vertices of the virtual octagon, and the first sub-pixels R and the third sub-pixels B are alternately arranged clockwise. One of the third sub-pixels B is located in the center of the virtual octagon.

In the embodiments of the present disclosure, optionally, for the virtual quadrilateral, the second sub-pixel G is approximately symmetrical with respect to a connection line of the centers of the first sub-pixel R that are adjacently arranged in the second oblique line direction or the first oblique line direction. That is, the second sub-pixel G is on a symmetry axis of two first sub-pixel R. Optionally, as shown in FIG. 14, for one of the first sub-pixel R, a width in a direction of the symmetry axis is smaller than a width in a direction of the other symmetry axis; for the other of the first sub-pixel R, a width in the direction of the symmetry axis is greater than a width in the direction of the other symmetry axis (that is, the long sides of the two first sub-pixels R of the virtual quadrilateral are perpendicular or approximately perpendicular). Or, for each of the two first sub-pixels R, a width in a direction of the symmetry axis is smaller than a width in a direction of the other symmetry axis (that is, the long sides of the two first sub-pixels R of the virtual quadrilateral are parallel).

For different circumstances in the above embodiments, distances between the sub-pixels of the virtual quadrilateral are changed; there exist at least some virtual quadrilaterals in which distances from the two first sub-pixels R to the second sub-pixel G are different. Description are provided in the following with examples.

Figure 15:
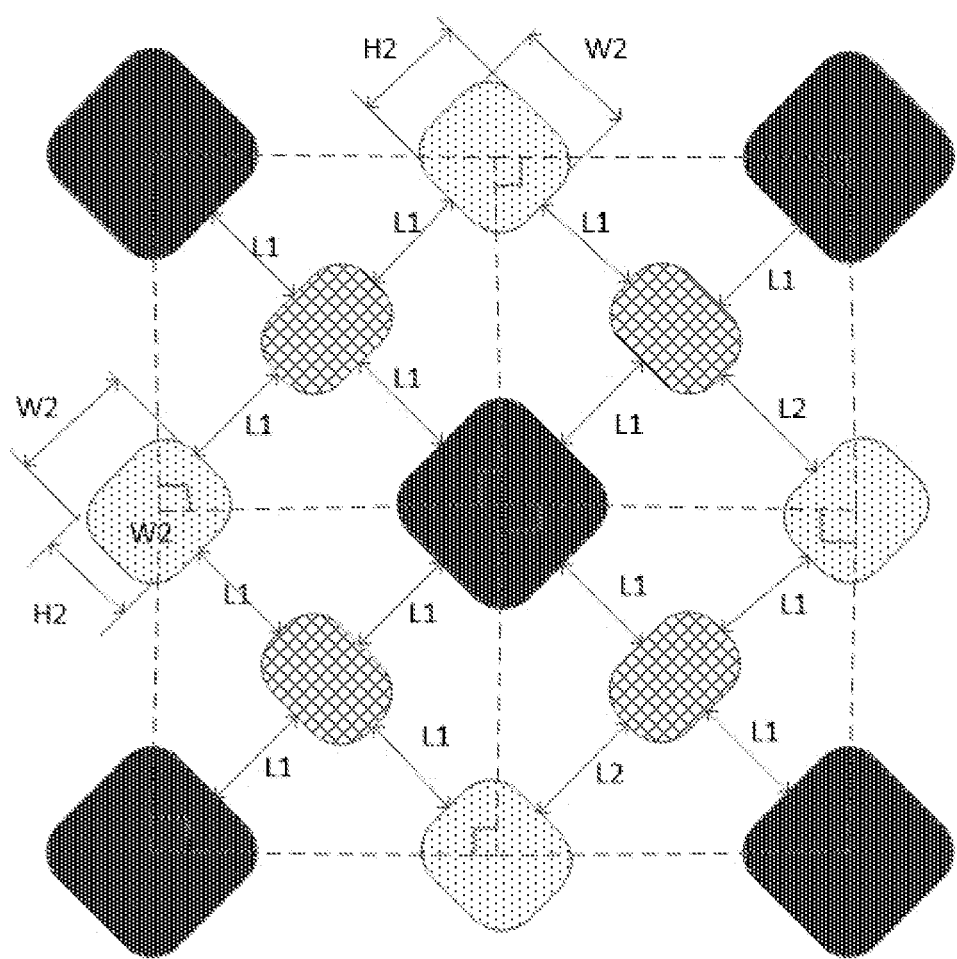

In some embodiments of the present disclosure, optionally, reference is made to FIG. 15. In at least one of the virtual quadrilaterals, each of the distance from the second sub-pixel G to the two third sub-pixels B and the two first sub-pixels R is L1 (two virtual quadrilaterals on the left side of FIG. 15) or L2 (not shown in the figure), where L2 is greater than L1.

In some embodiments of the present disclosure, optionally, referring to FIG. 15, in at least one of the virtual quadrilaterals (two virtual quadrilaterals on the right side of FIG. 8), the distance from the second sub-pixel G to the two third sub-pixels B are both L1, the distance from the second sub-pixel G to the first one of the first sub-pixels R is L1, and the distance from the second sub-pixel G to the second one of the first sub-pixels R is L2, where L2 is greater than L1.

In the above embodiments, optionally, a difference between L2 and L1 is greater than or equal to 1 μm, and further optionally, the difference between L2 and L1 is greater than or equal to 2 μm or 3 μm.

In the above embodiments, optionally, a range of L1 is 12-30 μm, further optionally, the range of L1 is 14-28 μm, and further optionally, the range of L1 is 16-26 μm.

In the embodiments of the present disclosure, optionally, reference is made to FIG. 14. The virtual quadrilateral is a right-angled trapezoid, two interior angles thereof each are 90°, and one of the other two interior angles thereof is an obtuse angle which is X°, and one of the other two interior angles thereof is an acute angle which is Y°. The range of obtuse angle is greater than 900 and less than or equal to 100°, further optionally, being 91°-96°. The range of acute angle is greater than or equal to 80° and less than 90°, and further optionally, being 84°-89°.

It can be seen from FIG. 14 that, after a virtual quadrilateral is rotated 90°+X° or rotated 90°+Y° around the center of the third sub-pixel located in the center of the virtual octagon, it may coincide with a diagonal virtual quadrilateral.

In the above embodiments, optionally, for the first sub-pixel, a difference between its width in the first oblique line direction and its width in the second oblique line direction is greater than or equal to 1 µm, and further optionally, being greater than or equal to 3 µm.

In the embodiments shown in FIG. 14 and FIG. 15, optionally, the third sub-pixel B has a square shape.

In the embodiments shown in FIGS. 3 to 6, the third sub-pixel has different widths in different oblique line directions. In the embodiments shown in FIGS. 14 and 15, the first sub-pixel has different widths in different oblique line directions. In some other embodiments of the present disclosure, it is also feasible that: the third sub-pixel has different widths in different oblique line directions while the first sub-pixel has different widths in different oblique line directions.

In the above embodiments of the present disclosure, optionally, the second sub-pixel G has different widths in the first oblique line direction and the second oblique line direction.

In the above embodiments of the present disclosure, optionally, for a virtual quadrilateral, the second sub-pixel G is approximately symmetrical with respect to a connection line of the centers of the two third sub-pixels B that are adjacent in the first oblique line direction or the second oblique line direction, and is approximately symmetrical with respect to a connection line of the centers of the two first sub-pixels R that are adjacent in the second oblique line direction or the first oblique line direction.

The human eyes have different resolution capabilities for the first sub-pixel R, the second sub-pixel G, and the third sub-pixel B. The brightness effects of the three kinds of sub-pixels are also different. The second sub-pixel G has the largest brightness effect, followed by the first sub-pixel R, and the third sub-pixel B has the smallest brightness effect. In addition, organic light-emitting materials of different colors have different device life. Therefore, optionally, the total opening areas of the sub-pixels are as follows: the total opening area of third sub-pixels B>the total opening area of second sub-pixels G>the total opening area of the first sub-pixels R. That is, the total opening area of the third sub-pixels B, the total opening area of the second sub-pixels G, and the total opening area of the first sub-pixels R decrease sequentially, the total opening area of the first sub-pixels R is x, the total opening area of the second sub-pixels G is a*x, and the total opening area of the third sub-pixels B is b*x, where $0.5 \leq a \leq 0.8$ and $1 \leq b \leq 2.2$. In the embodiments of the present disclosure, a total opening area of sub-pixels refers to a total light-emitting area of the sub-pixels on the entire panel. In the above embodiments of the present disclosure, a case where the shapes of the first sub-pixel, the second sub-pixel, and the third sub-pixel are all quadrilaterals with rounded corners is taken as an example. In some embodiments, optionally, the shapes of the first sub-pixel, the second sub-pixel, and the third sub-pixel may be other polygons; or, the shapes of the first sub-pixel, the second sub-pixel, and the third sub-pixel may be any of: other types of polygons with rounded corners, circle, or ellipse.

In some other embodiments of the present disclosure, optionally, each of the shapes of the first sub-pixel, the second sub-pixel, and the third sub-pixel may be selected from a quadrilateral, a hexagon, an octagon, a hexagon with rounded corners, an octagonal with rounded corners, a circle, or an ellipse.

In the above embodiments of the present disclosure, a case where the first sub-pixel is a red sub-pixel (R), the second sub-pixel is a green sub-pixel (G), and the third sub-pixel is a blue sub-pixel (B) is taken as an example, and the present disclosure does not exclude the use of sub-pixels of other colors.

In the above embodiments of the present disclosure, the ratio of the numbers of the first sub-pixels, the second sub-pixels, and the third sub-pixels is 1:2:1, so as to realize the sharing of sub-pixels and improve the resolution.

Embodiments of the present disclosure also provide a display device, including the above display substrate.

In embodiments of the present disclosure, optionally, the display device further includes a pixel defining layer, the pixel defining layer includes multiple pixel defining layer openings, each of the first sub-pixels, the second sub-pixels and the third sub-pixels corresponds to a pixel defining layer opening of the multiple pixel defining layer openings, and shapes of the first sub-pixel, the second sub-pixel and the third sub-pixel are approximately the same as shapes of their respective pixel defining layer openings.

In the embodiments of the present disclosure, optionally, the first sub-pixel includes multiple films, and the multiple films of the first sub-pixel at least partially cover a region outside the pixel defining layer opening; and/or, the second sub-pixel includes multiple films, and the multiple films of the second sub-pixel at least partially cover a region outside the pixel defining layer opening; and/or, the third sub-pixel includes multiple films, and the multiple films of the third sub-pixel at least partially cover a region outside the pixel defining layer opening.

In the embodiments of the present disclosure, optionally, at least some of the multiple pixel defining layer openings are different in shapes or areas.

In the embodiments of the present disclosure, optionally, at least some of the pixel defining layer openings corresponding to the first sub-pixels or the third sub-pixels are different in shapes or areas.

In the embodiments of the present disclosure, optionally, at least some of the pixel defining layer openings corresponding to the first sub-pixels or the third sub-pixels have different minimum distances from their respective adjacent openings.

Embodiments of the present disclosure also provide a high-precision metal mask, which is used to manufacture the display substrate in any of the above embodiments. The first sub-pixel includes multiple films, the second sub-pixel includes multiple films, the third sub-pixel includes multiple films, the mask includes multiple opening regions, and the multiple opening regions includes: a first opening region corresponding to a shape and a distribution of at least one film in the first sub-pixel, or a second opening region corresponding to a shape and a distribution of at least one film in the second sub-pixel, or a third opening region corresponding to a shape and a distribution of at least one film in the third sub-pixel.

A shape refers to pattern type and/or size, etc., and a distribution refers to spacing, orientation, and/or density, etc.

Figure 16:
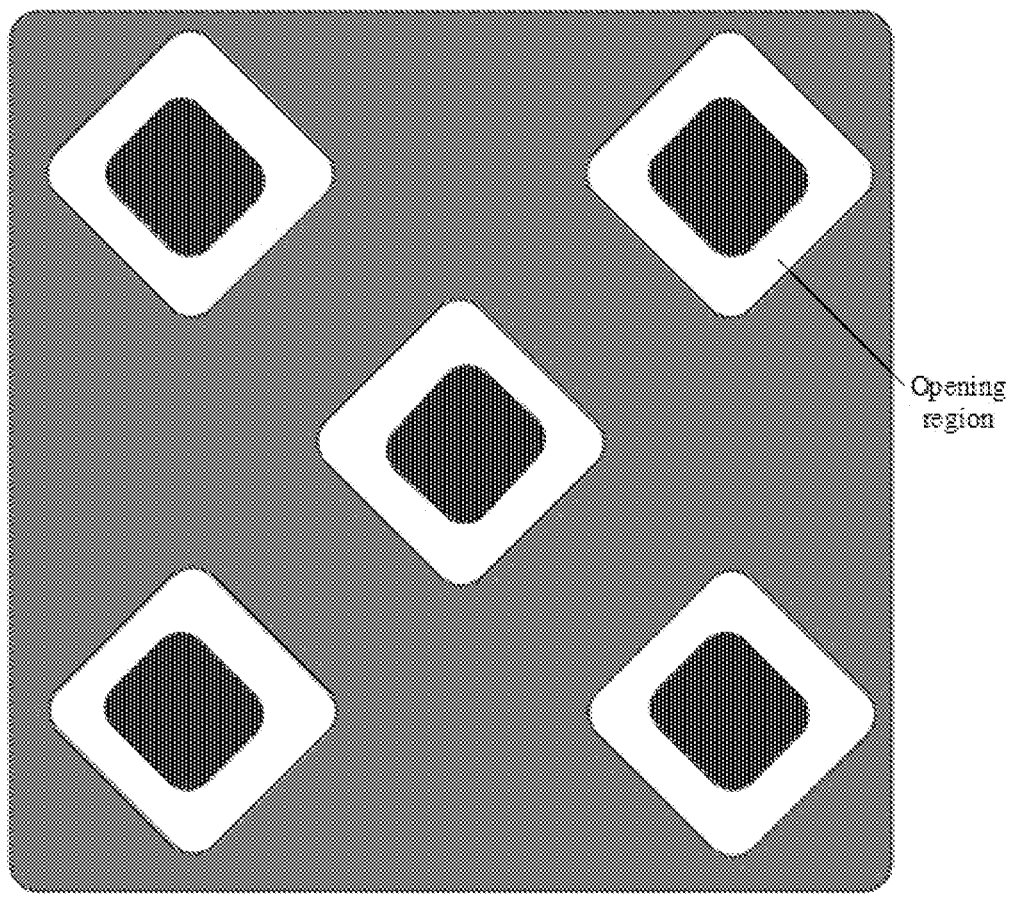
FIG. 16-18 are schematic diagrams of a high-precision metal mask used to manufacture first sub-pixels, second sub-pixels, and third sub-pixels in a display substrate according to above embodiments.
Figure 17:
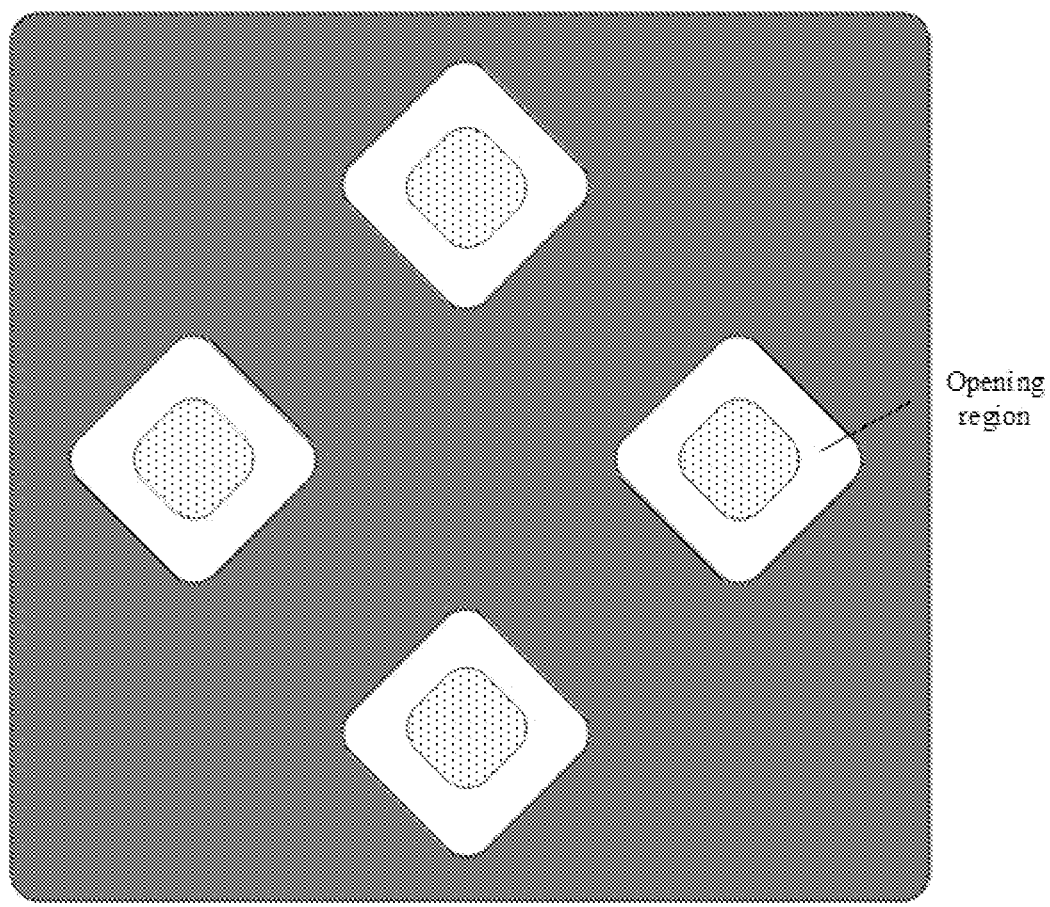
Figure 18:
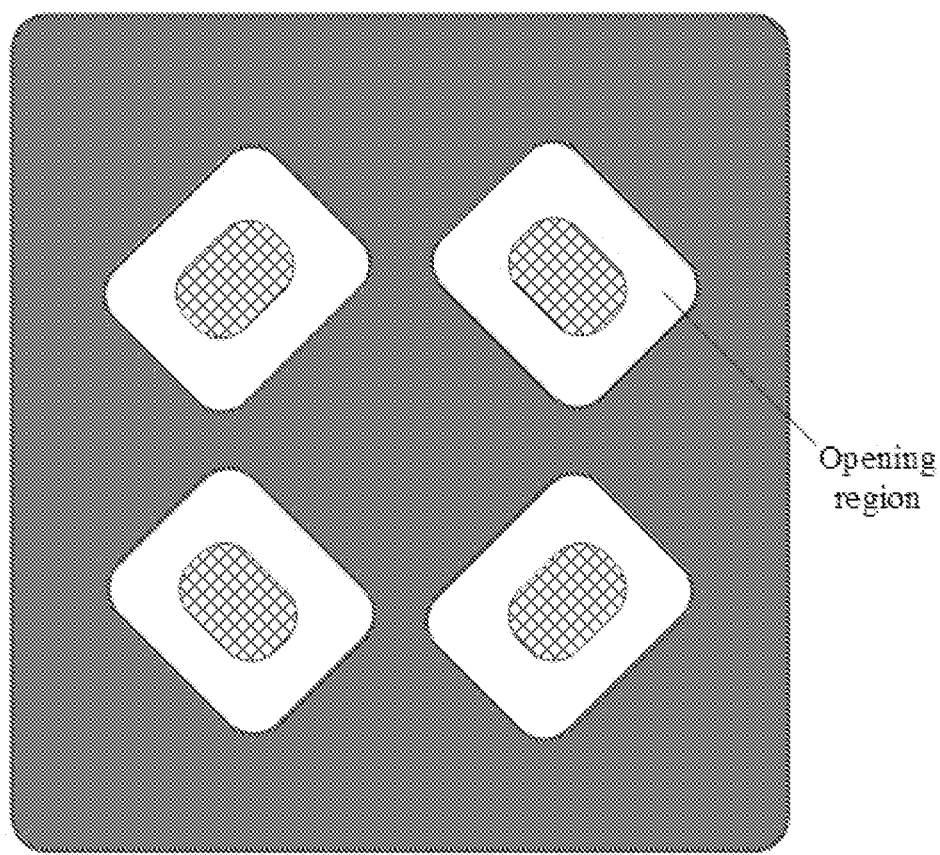

Please refer to FIGS. 16-18, which are schematic diagrams of the high-precision metal mask used to manufacture the first sub-pixels, the second sub-pixels, and the third sub-pixels of the display substrate in the above embodiments. The first sub-pixels, the second sub-pixels or the third sub-pixels are shown in the opening regions, and the first sub-pixels, the second sub-pixels or the third sub-pixels are not part of the mask.

In some embodiments, a first sub-pixel includes a first effective light-emitting region, a second sub-pixel includes a second effective light-emitting region, a third sub-pixel includes a third effective light-emitting region, and an area of the second effective light-emitting region<an area of the first effective light-emitting region<an area of the third effective light-emitting region. In a display substrate, the total area of all the third effective light-emitting regions included in the third sub-pixels>the total area of all the second effective light-emitting regions included in the second sub-pixels>the total area of all the first effective light-emitting regions included in the first sub-pixels. In some embodiments, each of the first effective light-emitting regions, each of the second effective light-emitting regions, and each of the third effective light-emitting regions are separated. In some embodiments, the first effective light-emitting regions, the second effective light-emitting regions, and the third effective light-emitting regions are defined by multiple separate openings formed in the pixel defining layer. In some embodiments, each first effective light-emitting region is defined by a light-emitting layer that is driven to emit light, where the light-emitting layer is between opposite anodes and cathodes in a direction perpendicular to the base substrate in its corresponding first sub-pixel. In some embodiments, each second effective light-emitting region is defined by a light-emitting layer that is driven to emit light, where the light-emitting layer is between opposite anodes and cathodes in a direction perpendicular to the base substrate in its corresponding second sub-pixel. In some embodiments, each third effective light-emitting region is defined by a light-emitting layer that is driven to emit light, where the light-emitting layer is between opposite anodes and cathodes in a direction perpendicular to the base substrate in its corresponding third sub-pixel. In some embodiments, each of the first effective light-emitting regions, the second effective light-emitting regions, and the third effective light-emitting regions is defined by a corresponding light-emitting layer and a corresponding electrode (anode or cathode) transporting carriers (holes or electrons) of the light-emitting layer or part of the electrode. In some embodiments, each of the first effective light-emitting regions, the second effective light-emitting regions, and the third effective light-emitting regions is defined by at least part of the cathode and at least part of the anode, orthographic projections of which are overlapped on the base substrate, orthographic projections of at least part of the cathode and at least part of the anode do not overlap an orthographic projection of a first insulating layer on the base substrate, and the first insulating layer is located between the cathode and the anode in a direction perpendicular to the base substrate. For example, the first insulating layer includes a pixel defining layer. In some embodiments, each of the first sub-pixels, of the second sub-pixels, and of the third sub-pixels includes a first electrode, a light-emitting layer located on a side of the first electrode away from the base substrate, and a second electrode on a side of the light-emitting layer far from the first electrode; in the direction perpendicular to the base substrate, a second insulating layer is provided between the first electrode and the light-emitting layer, and/or between the second electrode and the light-emitting layer, a projection of the second insulating layer onto the base substrate overlaps with a projection of the first electrode or the second electrode onto the base substrate, and the second insulating layer has an opening; on the side facing the light-emitting layer, the opening of the second insulating layer may expose at least part of the first electrode or the second electrode, so that it may be in contact with the light-emitting layer or an auxiliary light-emitting functional layer; each of the first effective light-emitting regions, the second effective light-emitting regions and the third effective light-emitting regions is defined by a part of the first electrode or the second electrode, where the part is in contact with the light-emitting layer or the auxiliary light-emitting functional layer. In some embodiments, the second insulating layer includes a pixel defining layer. In some embodiments, the auxiliary light-emitting functional layer may be any one or more of: a hole injection layer, a hole transport layer, an electron transport layer, a hole blocking layer, an electron blocking layer, an electron injection layer, an auxiliary light-emitting layer, an interface improvement layer, or an anti-reflection layer. In some embodiments, the first electrode may be an anode and the second electrode may be a cathode. In some embodiments, the first electrode may include at least two stacked layers of indium tin oxide (ITO) and silver (Ag), for example, including three stacked layers of ITO, Ag and ITO. In some embodiments, the second electrode may include any one or more of: magnesium (Mg), Ag, ITO, or indium zinc oxide (IZO), for example, including a mixed layer or alloy layer of Mg and Ag.

Each sub-pixel includes a light-emitting layer, each first sub-pixel includes a first-color light-emitting layer located in the opening and on the pixel defining layer, and each second sub-pixel includes a second-color light-emitting layer located in the opening and on the pixel defining layer, and each third sub-pixel includes a third-color light-emitting layer located in the opening and on the pixel defining layer.

Reference is made to FIG. 8. In FIG. 8, the first effective light-emitting region of the first sub-pixel is the region pointed by the arrow corresponding to R, the second effective light-emitting region of the second sub-pixel is the region pointed by the arrow corresponding to G, and the third effective light-emitting region of the third sub-pixel is the region pointed by the arrow corresponding to B, and the frame around the effective light-emitting region is the region of the corresponding light-emitting layer.

Figure 19:
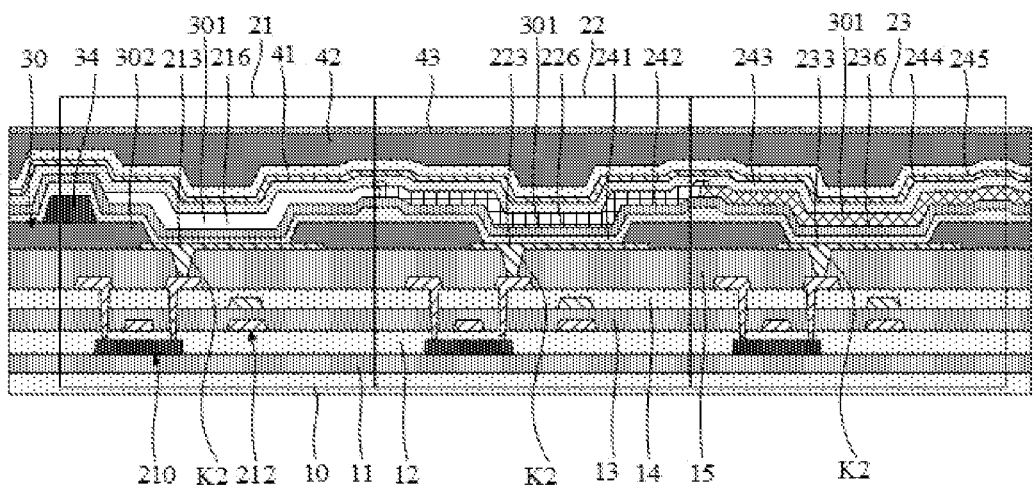
FIG. 19 is a schematic diagram of a cross-sectional structure of a display substrate according to embodiments of the present disclosure.

In some exemplary embodiments, the manufacture process of the display substrate of the embodiments may include the following steps (1) to (9). In the exemplary embodiments, reference is made to FIG. 19, and a flexible display substrate with a top-emitting structure is taken as an example for description.

(1) A base substrate is manufactured on a glass plate.

In some exemplary embodiments, the base substrate 10 may be a flexible base substrate, for example, including a first flexible material layer, a first inorganic material layer, a semiconductor layer, a second flexible material layer and a second inorganic material layer that are stacked on the glass plate. The materials of the first flexible material layer and the second flexible material layer are materials such as polyimide (PI), polyethylene terephthalate (PET), or surface-treated polymer soft film, etc. The first inorganic material layer and the second inorganic material layer are made of silicon nitride (SiNx) or silicon oxide (SiOx), etc., to improve water and oxygen resistance of the base substrate. The first inorganic material layer and the second inorganic material layer may also be called a barrier layer. The material of the semiconductor layer is amorphous silicon (a-si). In some exemplary embodiments, taking the laminated structure of PI1/Barrier1/a-si/PI2/Barrier2 as an example, the preparation process thereof includes: coating a layer of polyimide on the glass plate and curing it to form a film so as to form the first flexible (PI1) layer; depositing a barrier film on the first flexible layer to form a first barrier (Barrier1) layer covering the first flexible layer; depositing an amorphous silicon film on the first barrier layer to form the amorphous silicon (a-si) layer covering the first barrier layer; coating a layer of polyimide on the amorphous silicon layer, and curing it to form a film so as to form the second flexible (PI2) layer; depositing a barrier film on the second flexible layer to form the second barrier (Barrier2) layer covering the second flexible layer, thereby completing the manufacture of the base substrate 10.

(2) A drive structure layer is manufactured on the base substrate.

The driving structure layer includes multiple driving circuits, and each driving circuit includes multiple transistors and at least one storage capacitor, such as a 2T1C, 3T1C, or 7T1C design.

In some exemplary embodiments, the manufacture process of the driving structure layer may refer to the following description. The manufacture process of the driving circuit of the first sub-pixel 21 is taken as an example for description.

A first insulating film and an active film are sequentially deposited on the base substrate 10, and the active film is patterned through a patterning process, to form a first insulating layer 11 covering the entire base substrate 10, and the active layer pattern arranged on the first insulating layer 11, where the active layer pattern includes at least a first active layer.

A second insulating film and a first metal film are sequentially deposited, and the first metal film is patterned through a patterning process, to form a second insulating layer 12 covering the active layer pattern and a first gate metal layer pattern arranged on the second insulating layer 12, where the first gate metal layer pattern includes at least a first gate electrode and a first capacitor electrode.

A third insulating film and a second metal film are sequentially deposited, and the second metal film is patterned through a patterning process, to form a third insulating layer 13 covering the first gate metal layer and a second gate metal layer pattern arranged on the third insulating layer 13, where the second gate metal layer pattern includes at least a second capacitor electrode, and the position of the second capacitor electrode corresponds to the position of the first capacitor electrode.

A fourth insulating film is deposited, and the fourth insulating film is patterned through a patterning process, to form a pattern of a fourth insulating layer 14 covering the second gate metal layer. The fourth insulating layer 14 is provided with at least two first via holes. Parts of fourth insulating layer 14, the third insulating layer 13, and the second insulating layer 12 in the two first via holes are removed by etching, to expose the surface of the first active layer.

A third metal film is deposited, and the third metal film is patterned through a patterning process, to form a pattern of a source-drain metal layer on the fourth insulating layer 14. The source-drain metal layer includes at least a first source electrode and a first drain electrode located in the display region. The first source electrode and the first drain electrode may be respectively connected to the first active layer through the first via holes.

In the driving circuit of the first sub-pixel 21 in the display region, the first active layer, the first gate electrode, the first source electrode, and the first drain electrode may form a first transistor 210, and the first capacitor electrode and the second capacitor electrode may form a first storage capacitor 212. In the above manufacture process, the driving circuit of the second sub-pixel 22 and the driving circuit of the third-color sub-pixel 23 may be formed at the same time.

In some exemplary embodiments, each of the first insulating layer 11, the second insulating layer 12, the third insulating layer 13, and the fourth insulating layer 14 may use any one or more or composite layer of: silicon oxide (SiOx), silicon nitride (SiNx), or silicon oxynitride (SiON), which may be a single layer, a multi-layer or a composite layer. The first insulating layer 11 is called a buffer layer, which is used to improve the water and oxygen resistance of the base substrate; the second insulating layer 12 and the third insulating layer 13 are called a gate insulator (GI) layer; the fourth insulating layer 14 is called an interlayer dielectric (ILD) layer. The first metal film, the second metal film and the third metal film are made of metal materials, such as any one or more of: silver (Ag), copper (Cu), aluminum (Al), titanium (Ti), or molybdenum (Mo), or alloy materials of the above metals, such as aluminum neodymium alloy (AlNd) or molybdenum niobium alloy (MoNb), each of which may have a single-layer structure or a multilayer composite structure, such as Ti/Al/Ti. The active film uses one or more materials of amorphous indium gallium zinc oxide (a-IGZO), zinc oxynitride (ZnON), indium zinc tin oxide (IZTO), amorphous silicon (a-Si), polysilicon (p-Si), sexithiophene or polythiophene, that is, the present disclosure is applicable to transistors manufactured based on oxide technology, silicon technology, and organic material technology.

(3) A planarization layer is formed on the base substrate on which the aforementioned pattern is formed.

In some exemplary embodiments, a planarization film of organic material is coated on the base substrate 10 on which the aforementioned pattern is formed, to form a planarization (Planarization, PLN) layer 15 covering the entire base substrate 10, and masking, exposure, development processes are used to form multiple second via holes K2 in the planarization layer 15 in the display region. The flat layer 15 in the multiple second via holes K2 is removed by developing, to expose the surface of the first drain electrode of the first transistor 210 of the driving circuit of the first sub-pixel 21, the surface of the first drain electrode of the first transistor the driving circuit of the second sub-pixel 22, and the surface of the first drain electrode of the first transistor of the driving circuit of the third-color sub-pixel 23.

(4) A pattern of a first electrode is formed on the base substrate on which the aforementioned pattern is formed. In some examples, the first electrode is a reflective anode.

In some exemplary embodiments, a conductive film is deposited on the base substrate 10 on which the aforementioned pattern is formed, and the conductive film is patterned through a patterning process to form the pattern of the first electrode. The first anode 213 of the first sub-pixel 21 is connected to the first drain electrode of the first transistor 210 through the second via K2, the second anode 223 of the second sub-pixel 22 is connected to the first drain electrode of the first transistor of the second sub-pixel 22 through the second via K2, and the third anode 233 of the third-color sub-pixel 23 is connected to the first drain electrode of the first transistor of the third-color sub-pixel 23 through the second via hole K2.

In some examples, the first electrode may use a metal material, such as any one or more of: magnesium (Mg), silver (Ag), copper (Cu), aluminum (Al), titanium (Ti), or molybdenum (Mo), or an alloy material of the above metals, such as aluminum neodymium alloy (AlNd) or molybdenum niobium alloy (MoNb), which may have a single-layer structure, or a multilayer composite structure, such as Ti/Al/Ti, etc., or a stacked structure formed by metal and transparent conductive material, for example, reflective material such as ITO/Ag/ITO, Mo/AlNd/ITO, etc.

(5) A pattern of a Pixel Definition Layer (PDL) layer is formed on the base substrate on which the aforementioned pattern is formed.

In some exemplary embodiments, a pixel definition film is coated on the base substrate 10 on which the aforementioned pattern is formed, and the pattern of the pixel definition layer is formed through masking, exposure, and development processes. The pixel definition layer 30 in the display region includes multiple sub-pixel definition portions 302. Multiple pixel definition layer openings 301 are formed between adjacent sub-pixel definition portions 302, and the pixel definition layer 30 in the multiple pixel definition layer openings 301 is removed by developing, to expose at least part of the surface of the first anode 213 of the first sub-pixel 21, at least part of the surface of the second anode 223 of the second sub-pixel 22, and at least part of the surface of the third anode 233 of the third-color sub-pixel 23.

In some examples, the pixel definition layer 30 may use polyimide, acrylic, polyethylene terephthalate, or the like.

(6) A pattern of post spacers (PS) is formed on the base substrate on which the aforementioned pattern is formed.

In some exemplary embodiments, a film of organic material is coated on the base substrate 10 on which the aforementioned pattern is formed, and the pattern of post spacers 34 is formed through processes of masking, exposure, and development. The pattern of post spacers 34 may be used as a support layer and are configured to support the FMM during the evaporation process. In some examples, in the row arrangement direction of the sub-pixels, there is a repeating unit between two adjacent post spacers 34. For example, the post spacer 34 may be located in the first sub-pixel 21 and third-color sub-pixel 23 that are adjacent.

(7) On the base substrate on which the aforementioned pattern is formed, an organic functional layer and a second electrode are sequentially formed.

In some examples, the second electrode is a transparent cathode. The light-emitting element may emit light from a side away from the base substrate 10 through the transparent cathode to achieve top emission. In some examples, the organic functional layer of the light-emitting element includes: a hole injection layer, a hole transport layer, a light-emitting layer, and an electron transport layer.

In some exemplary embodiments, the hole injection layer 241 and the hole transport layer 242 are sequentially formed through evaporation by using an open mask on the base substrate 10 on which the aforementioned pattern is formed, then FMM is used to sequentially form, through evaporation, a blue light-emitting layer 236, a green light-emitting layer 216, and a red light-emitting layer 226, and then an open mask is used to sequentially form, through evaporation, the electron transport layer 243, the cathode 244, and the light coupling layer 245. The hole injection layer 241, the hole transport layer 242, the electron transport layer 243, and the cathode 244 are common layers for multiple sub-pixels. In some examples, the organic functional layer may further include a microcavity adjustment layer located between the hole transport layer and the light-emitting layer. For example, after forming the hole transport layer, FMM may be used to sequentially form, through evaporation, a blue microcavity adjustment layer, a blue light-emitting layer, a green microcavity adjustment layer, a green light-emitting layer, a red microcavity adjustment layer, and a red light-emitting layer.

In some exemplary embodiments, the organic functional layer is formed in the sub-pixel region to realize the connection between the organic functional layer and the anode. The cathode is formed on the pixel definition layer and connected with the organic functional layer.

In some exemplary embodiments, the cathode may use any one or more of magnesium (Mg), silver (Ag), aluminum (Al), or use an alloy made of any one or more of the foregoing metals, or use a transparent conductive material, such as indium tin oxide (ITO), or a multilayer composite structure of metal and transparent conductive material.

In some exemplary embodiments, the light coupling layer may be formed on a side of the cathode 244 away from the base substrate 10, and the light coupling layer may be a common layer for multiple sub-pixels. The light coupling layer may cooperate with the transparent cathode to increase the light output. For example, the material of the light coupling layer may be a semiconductor material. However, the embodiments are not limited thereto.

(8) An encapsulation layer is formed on the base substrate on which the aforementioned pattern is formed.

In some exemplary embodiments, the encapsulation layer is formed on the base substrate 10 on which the aforementioned pattern is formed, and the encapsulation layer may include a first encapsulation layer 41, a second encapsulation layer 42, and a third encapsulation layer 43 that are stacked. The first encapsulation layer 41 uses inorganic material and covers the cathode 244 in the display region. The second encapsulation layer 42 uses organic material. The third encapsulation layer 43 uses inorganic material and covers the first encapsulation layer 41 and the second encapsulation layer 42. However, the embodiments are not limited thereto. In some examples, the encapsulation layer may adopt a five-layer structure of inorganic/organic/inorganic/organic/inorganic.

The above descriptions illustrate some implementations of the present disclosure. It should be noted that for those skilled in the art, without departing from the principles of the present disclosure, various improvements and polishments may be made. These improvements and polishments shall fall within the protection scope of the present disclosure.

What is claimed is:

1. A display substrate, comprising: first sub-pixels, second sub-pixels and third sub-pixels;
   wherein in a first direction, the first sub-pixels and the third sub-pixels are alternately arranged to form first sub-pixel rows, and the second sub-pixels form second sub-pixel rows;
   wherein in a second direction, the first sub-pixel rows and the second sub-pixel rows are alternately arranged, and the first direction and the second direction are substantially perpendicular;
   wherein two first sub-pixels and two third sub-pixels in two adjacent rows and two adjacent columns form a 2*2 array; in the 2*2 array, the two first sub-pixels are in different rows and in different columns, the two third sub-pixels are in different rows and in different columns, connection lines of centers of the two first sub-pixels and the two third sub-pixels form a virtual quadrilateral, and the second sub-pixel is within the virtual quadrilateral;

wherein, for a plurality of distances from the centers of the two first sub-pixels and the centers of the two third sub-pixels corresponding to a same virtual quadrilateral to a center of the second sub-pixel, at least two distances among the plurality of distances are different;

wherein: the third sub-pixel has a symmetry axis along a first oblique line direction and a symmetry axis along a second oblique line direction, and a width of the third sub-pixel in the first oblique line direction is different from that in the second oblique line direction; and/or, the first sub-pixel has a symmetry axis along a first oblique line direction and a symmetry axis along a second oblique line direction, and a width of the first sub-pixel in the first oblique line direction is different from that in the second oblique line direction;

wherein the second oblique line direction is substantially perpendicular to the first oblique line direction, and the second oblique line direction and the first oblique line direction intersect both the first direction and the second direction;

wherein some of the virtual quadrilaterals each are a first parallelogram, and some of the virtual quadrilaterals each are a second parallelogram; in a row direction and in a column direction, the first parallelograms and the second parallelograms are arranged alternately; at least one interior angle of the first parallelogram and at least one interior angle of the second parallelogram are different.

2. The display substrate according to claim 1, wherein the two first sub-pixels and the two third sub-pixels corresponding to a same virtual quadrilateral surround a second sub-pixel; a minimum distance among distances from other first sub-pixels and other third sub-pixels outside the same virtual quadrilateral to the surrounded second sub-pixel, is greater than, a minimum distance among distances from the two first sub-pixels and the two third sub-pixels corresponding to the same virtual quadrilateral to the surrounded second sub-pixel.

3. The display substrate according to claim 1, wherein, for the plurality of distances from the centers of the two first sub-pixels and the centers of the two third sub-pixels corresponding to a same virtual quadrilateral to the center of the second sub-pixel, a ratio of any two distances among the plurality of distances is in a range of 0.7 to 1.3.

4. The display substrate of claim 1, wherein a difference between the distances from the centers of the two first sub-pixels to the center of the second sub-pixel corresponding to a same virtual quadrilateral, is smaller than, a difference between the distances from the centers of the two third sub-pixels to the center of the second sub-pixel corresponding to the same virtual quadrilateral.

5. The display substrate of claim 4, wherein for the same virtual quadrilateral, the distances from the centers of the two first sub-pixels to the center of the second sub-pixel are substantially equal.

6. The display substrate according to claim 1, wherein:
the first sub-pixel and the third sub-pixel each are an axisymmetric pattern, and a symmetry axis of at least one first sub-pixel and a symmetry axis of at least one third sub-pixel are parallel and do not coincide; and/or, the first sub-pixel has a symmetry axis in a first oblique direction, and the symmetry axes in the first oblique direction of two adjacent first sub-pixels in the first oblique direction do not coincide; and/or,
the third sub-pixel has a symmetry axis in the first oblique direction, and the symmetry axes in the first oblique direction of two adjacent third sub-pixels in the first oblique direction do not coincide.

7. The display substrate of claim 1, wherein for the second sub-pixel, a width in the first oblique line direction and a width in the second oblique line direction are different.

8. The display substrate of claim 7, wherein for the virtual quadrilateral, the second sub-pixel is approximately symmetrical with respect to a connection line of the centers of the two third sub-pixels that are adjacent in the first oblique line direction or the second oblique line direction, and is approximately symmetrical with respect to a connection line of the centers of the two first sub-pixels that are adjacent in the second oblique line direction or the first oblique line direction.

9. The display substrate according to claim 1, wherein four virtual quadrilaterals in an array form a virtual polygon, and the first sub-pixels and the third sub-pixels are on corners or edges of the virtual polygon, and are alternately distributed on the edges or the corners of the virtual polygon in a clockwise direction.

10. The display substrate of claim 1, wherein the total opening area of the first sub-pixels is x, the total opening area of the second sub-pixels is a*x, and the total opening area of the third sub-pixels is b*x, where $0.5 \leq a \leq 0.8$ and $1 \leq b \leq 2.2$.

11. The display substrate of claim 1, wherein the first sub-pixel is a red sub-pixel, the second sub-pixel is a green sub-pixel, and the third sub-pixel is a blue sub-pixel.

12. A high-precision metal mask for manufacturing the display substrate according to claim 1, wherein the first sub-pixel comprises a plurality of films, the second sub-pixel comprises a plurality of films, the third sub-pixel comprises a plurality of films, the high-precision metal mask comprises a plurality of opening regions, and the plurality of opening regions comprises: a first opening region corresponding to a shape and a distribution of at least one film in the first sub-pixel, or a second opening region corresponding to a shape and a distribution of at least one film in the second sub-pixel, or a third opening region corresponding to a shape and a distribution of at least one film in the third sub-pixel.

13. A display device, comprising a display substrate, wherein the display substrate comprises: first sub-pixels, second sub-pixels and third sub-pixels;
wherein in a first direction, the first sub-pixels and the third sub-pixels are alternately arranged to form first sub-pixel rows, and the second sub-pixels form second sub-pixel rows;
wherein in a second direction, the first sub-pixel rows and the second sub-pixel rows are alternately arranged, and the first direction and the second direction are substantially perpendicular;
wherein two first sub-pixels and two third sub-pixels in two adjacent rows and two adjacent columns form a 2*2 array; in the 2*2 array, the two first sub-pixels are in different rows and in different columns, the two third sub-pixels are in different rows and in different columns, connection lines of centers of the two first sub-pixels and the two third sub-pixels form a virtual quadrilateral, and the second sub-pixel is within the virtual quadrilateral;
wherein, for a plurality of distances from the centers of the two first sub-pixels and the centers of the two third sub-pixels corresponding to a same virtual quadrilateral to a center of the second sub-pixel, at least two distances among the plurality of distances are different;

wherein: the third sub-pixel has a symmetry axis along a first oblique line direction and a symmetry axis along a second oblique line direction, and a width of the third sub-pixel in the first oblique line direction is different from that in the second oblique line direction; and/or, the first sub-pixel has a symmetry axis along a first oblique line direction and a symmetry axis along a second oblique line direction, and a width of the first sub-pixel in the first oblique line direction is different from that in the second oblique line direction;

wherein the second oblique line direction is substantially perpendicular to the first oblique line direction, and the second oblique line direction and the first oblique line direction intersect both the first direction and the second direction;

wherein some of the virtual quadrilaterals each are a first parallelogram, and some of the virtual quadrilaterals each are a second parallelogram; in a row direction and in a column direction, the first parallelograms and the second parallelograms are arranged alternately; at least one interior angle of the first parallelogram and at least one interior angle of the second parallelogram are different.

14. The display device of claim 13, further comprising a pixel defining layer, wherein the pixel defining layer comprises a plurality of pixel defining layer openings, each of the first sub-pixels, the second sub-pixels and the third sub-pixels corresponds to a pixel defining layer opening of the plurality of pixel defining layer openings, and shapes of the first sub-pixel, the second sub-pixel and the third sub-pixel are approximately the same as shapes of their respective pixel defining layer openings.

15. The display device according to claim 14, wherein:
the first sub-pixel comprises a plurality of films, and the plurality of films of the first sub-pixel at least partially covers a region outside the pixel defining layer opening; and/or,
the second sub-pixel comprises a plurality of films, and the plurality of films of the second sub-pixel at least partially covers a region outside the pixel defining layer opening; and/or,
the third sub-pixel comprises a plurality of films, and the plurality of films of the third sub-pixel at least partially covers a region outside the pixel defining layer opening.

16. The display device according to claim 14, wherein at least some of the pixel defining layer openings corresponding to the first sub-pixels or the third sub-pixels have different minimum distances from their respective adjacent openings.

* * * * *